(12) United States Patent
Inui et al.

(10) Patent No.: US 12,414,392 B2
(45) Date of Patent: Sep. 9, 2025

(54) PHOTOELECTRIC CONVERSION DEVICE, IMAGING SYSTEM, AND MOBILE APPARATUS

(71) Applicant: CANON KABUSHIKI KAISHA, Tokyo (JP)

(72) Inventors: Fumihiro Inui, Yokohama (JP); Junji Iwata, Tokyo (JP); Hajime Ikeda, Yokohama (JP); Koichi Fukuda, Tokyo (JP); Kohei Okamoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 82 days.

(21) Appl. No.: 18/345,376

(22) Filed: Jun. 30, 2023

(65) Prior Publication Data

US 2023/0343798 A1    Oct. 26, 2023

Related U.S. Application Data

(63) Continuation of application No. 17/339,231, filed on Jun. 4, 2021, now Pat. No. 11,742,364, which is a
(Continued)

(30) Foreign Application Priority Data

Feb. 25, 2019 (JP) ................................ 2019-031823
Nov. 26, 2019 (JP) ................................ 2019-212961

(51) Int. Cl.
*G06T 7/55* (2017.01)
*H10F 39/00* (2025.01)
(Continued)

(52) U.S. Cl.
CPC ........... *H10F 39/8027* (2025.01); *G06T 7/55* (2017.01); *H10F 39/182* (2025.01);
(Continued)

(58) Field of Classification Search
None
See application file for complete search history.

(56) References Cited

U.S. PATENT DOCUMENTS 7,227,208 B2    6/2007 Ogura
7,561,199 B2    7/2009 Noda
(Continued)

FOREIGN PATENT DOCUMENTS

CN    107665897 A    2/2018
JP    2008-177738 A    7/2008
(Continued)

OTHER PUBLICATIONS

U.S. Appl. No. 16/775,579, filed Jan. 29, 2020 by Shunichi Wakashima et al.
(Continued)

*Primary Examiner* — Eileen M Adams
(74) *Attorney, Agent, or Firm* — VENABLE LLP

(57) ABSTRACT

Provided is a photoelectric conversion device including: a first substrate having a first face; photodiodes arranged in the first substrate and each having a first region that generates signal charges by photoelectrically converting an incident light and a second region that receives the signal charges moving from the first region; a first isolation region arranged in the first substrate at a first depth and including a first portion extending in a first direction so as to isolate the second regions from each other; and a second isolation region arranged in the first substrate at a second depth deeper than the first depth from the first face, and including a second portion extending in a second direction intersecting the first direction in plan view so as to isolate the first regions from each other, and the first and second portions are partially overlapped with each other in plan view.

26 Claims, 34 Drawing Sheets

Related U.S. Application Data continuation of application No. 16/780,666, filed on Feb. 3, 2020, now Pat. No. 11,056,519.

(51) Int. Cl.
 *H10F 39/12* (2025.01)
 *H10F 39/18* (2025.01)
(52) U.S. Cl.
 CPC ....... *H10F 39/199* (2025.01); *H10F 39/8063* (2025.01); *H10F 39/807* (2025.01); *G06T 2207/30252* (2013.01)

(56) References Cited

U.S. PATENT DOCUMENTS

| | | | |
|---|---|---|---|
| 7,719,587 | B2 | 5/2010 | Ogura |
| 8,259,205 | B2 | 9/2012 | Noda |
| 8,648,944 | B2 | 2/2014 | Iwata |
| 8,697,500 | B2 | 4/2014 | Iwata |
| 8,952,433 | B2 | 2/2015 | Inui |
| 9,165,964 | B2 | 10/2015 | Fukuda |
| 9,538,112 | B2 | 1/2017 | Wada |
| 9,543,340 | B2 | 1/2017 | Iwata |
| 9,979,916 | B2 | 5/2018 | Hiyama |
| 10,021,328 | B2 | 7/2018 | Takada |
| 10,121,816 | B2 | 11/2018 | Iwata |
| 10,204,943 | B2 | 2/2019 | Suzuki et al. |
| 10,298,867 | B2 | 5/2019 | Takada |
| 10,347,679 | B2 | 7/2019 | Kato |
| 10,424,613 | B2 | 9/2019 | Tsuboi |
| 10,453,879 | B2 | 10/2019 | Ikeda |
| 10,535,688 | B2 | 1/2020 | Onuki |
| 10,536,653 | B2 | 1/2020 | Ikeda |
| 10,805,563 | B2 | 10/2020 | Ikeda |
| 10,818,715 | B2 | 10/2020 | Iwata |
| 10,833,207 | B2 | 11/2020 | Iwata |
| 11,056,519 | B2 | 7/2021 | Inui |
| 11,056,520 | B2 | 7/2021 | Onuki |
| 11,076,117 | B2 | 7/2021 | Inui |
| 2011/0001861 | A1 | 1/2011 | Tanaka |
| 2011/0136291 | A1 | 6/2011 | Iwata |
| 2013/0083225 | A1 | 4/2013 | Minowa |
| 2015/0062367 | A1 | 3/2015 | Inui |
| 2015/0256778 | A1 | 9/2015 | Kusaka |
| 2016/0234449 | A1 | 8/2016 | Ishiwata |
| 2016/0309992 | A1* | 10/2016 | Stith ............... A61B 1/0005 |
| 2017/0212221 | A1 | 7/2017 | Goden |
| 2017/0345853 | A1* | 11/2017 | Kato ............... G02B 7/34 |
| 2018/0033896 | A1 | 2/2018 | Morimoto |
| 2018/0069046 | A1 | 3/2018 | Jin |
| 2018/0069137 | A1 | 3/2018 | Okamoto |
| 2018/0108800 | A1 | 4/2018 | Morimoto |
| 2018/0270405 | A1 | 9/2018 | Ota |
| 2018/0350856 | A1 | 12/2018 | Masagaki |
| 2018/0372539 | A1 | 12/2018 | Goden |
| 2018/0374886 | A1 | 12/2018 | Iwata |
| 2019/0037161 | A1 | 1/2019 | Ikeda |
| 2019/0131333 | A1 | 5/2019 | Borthakur |
| 2019/0259801 | A1 | 8/2019 | Seto |
| 2019/0326450 | A1 | 10/2019 | Iwata |
| 2020/0029044 | A1 | 1/2020 | Inui |
| 2020/0111828 | A1 | 4/2020 | Onuki |
| 2020/0378828 | A1 | 12/2020 | Kobayashi |
| 2021/0021777 | A1 | 1/2021 | Kobayashi |
| 2021/0134862 | A1* | 5/2021 | Ishida ............... H01L 27/14603 |

FOREIGN PATENT DOCUMENTS

| | | | |
|---|---|---|---|
| JP | 2011-53519 A | | 3/2011 |
| JP | 2013-80797 A | | 5/2013 |
| JP | 2014-72541 A | | 4/2014 |
| JP | 2015-65269 A | | 4/2015 |
| JP | 2017-212351 A | | 11/2017 |
| JP | 2018-41810 A | | 3/2018 |
| JP | 2018-64086 A | | 4/2018 |
| JP | 2018-157387 A | | 10/2018 |
| JP | 2019-7877 A | | 1/2019 |
| JP | 2020-141122 A | | 9/2020 |
| WO | 2017/130723 A1 | | 8/2017 |

OTHER PUBLICATIONS

U.S. Appl. No. 16/716,668, filed Dec. 17, 2019 by Hajime Ikeda et al.

U.S. Appl. No. 16/710,177, filed Dec. 11, 2019 by Fumihiro Inui et al.

U.S. Appl. No. 16/711,991, filed Dec. 12, 2019 by Hajime Ikeda.

Japanese Search Report issued Mar. 14, 2024 in corresponding Japanese Patent Application No. 2019-212961 (English translation included).

Chinese Search Report issued Oct. 19, 2023 in corresponding Chinese Patent Application No. 202010105808.1 (No translation available).

Japanese Search Report issued Jul. 31, 2025 in corresponding Japanese Patent Application No. 2024-156807 (English translation included).

* cited by examiner

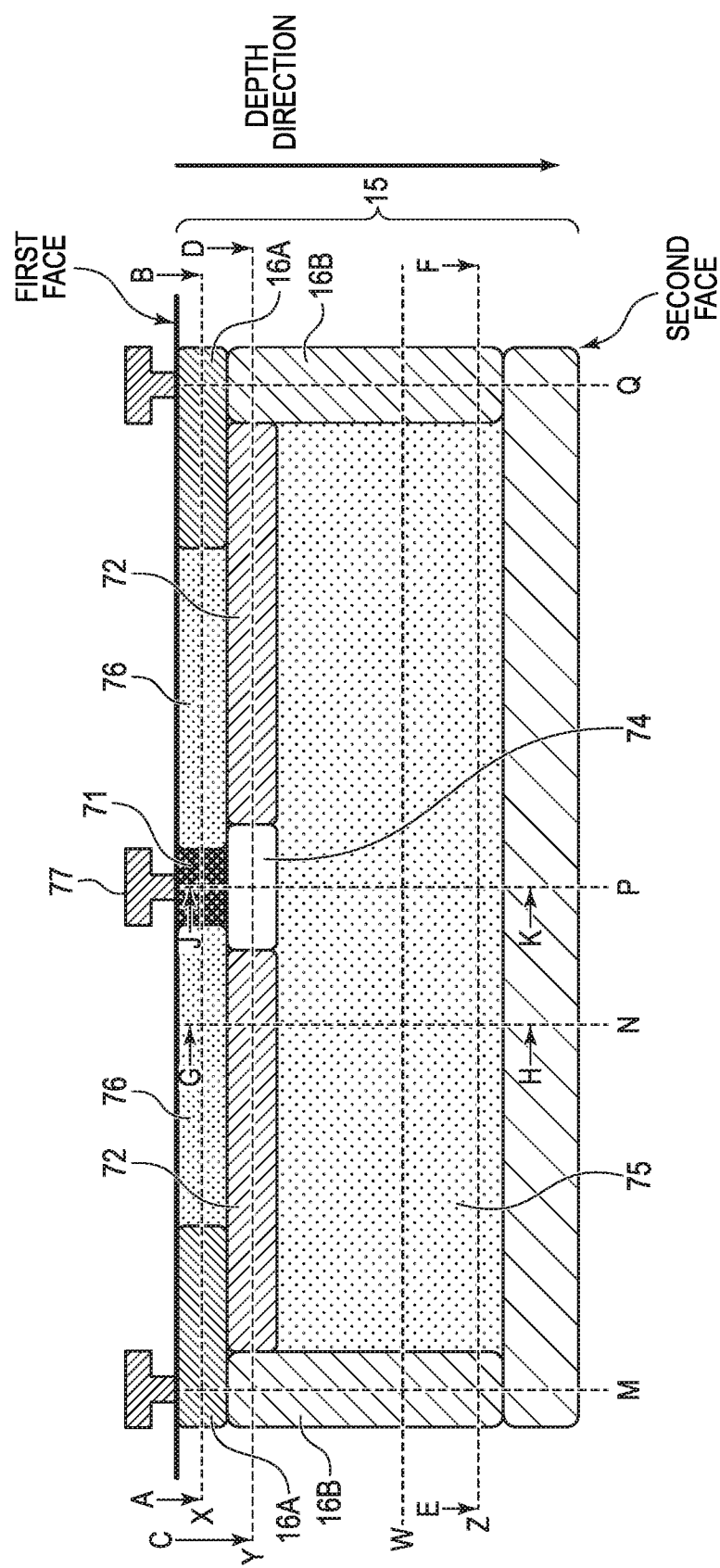

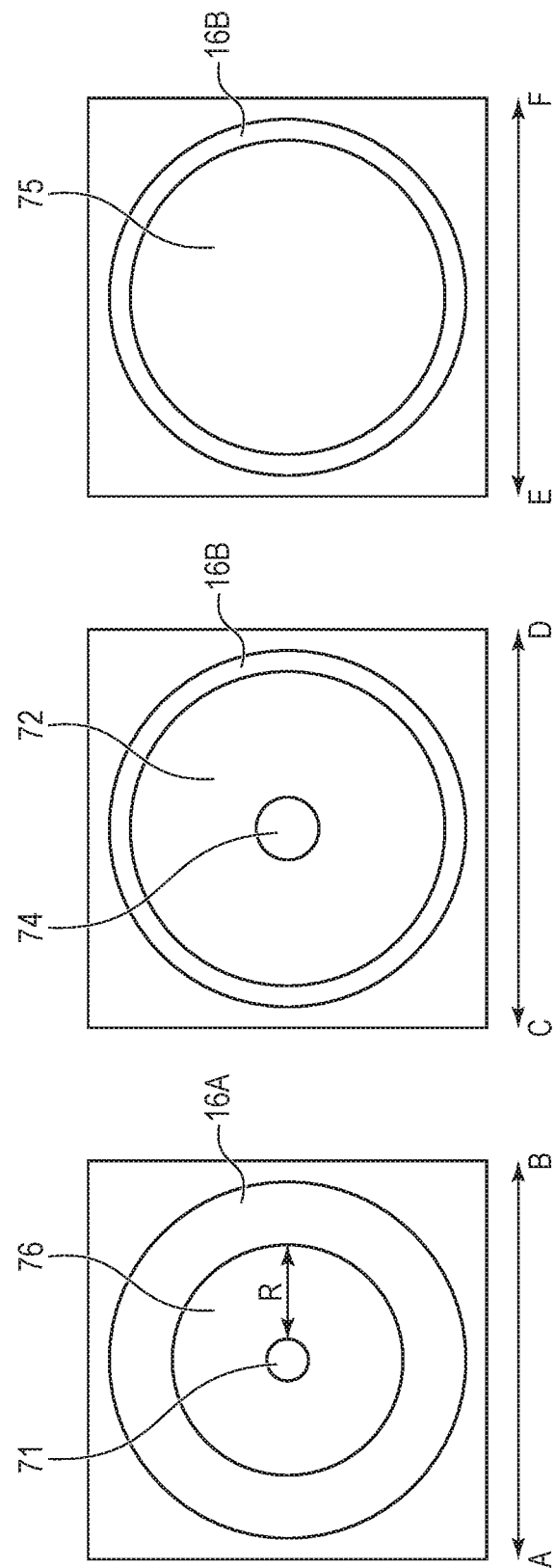

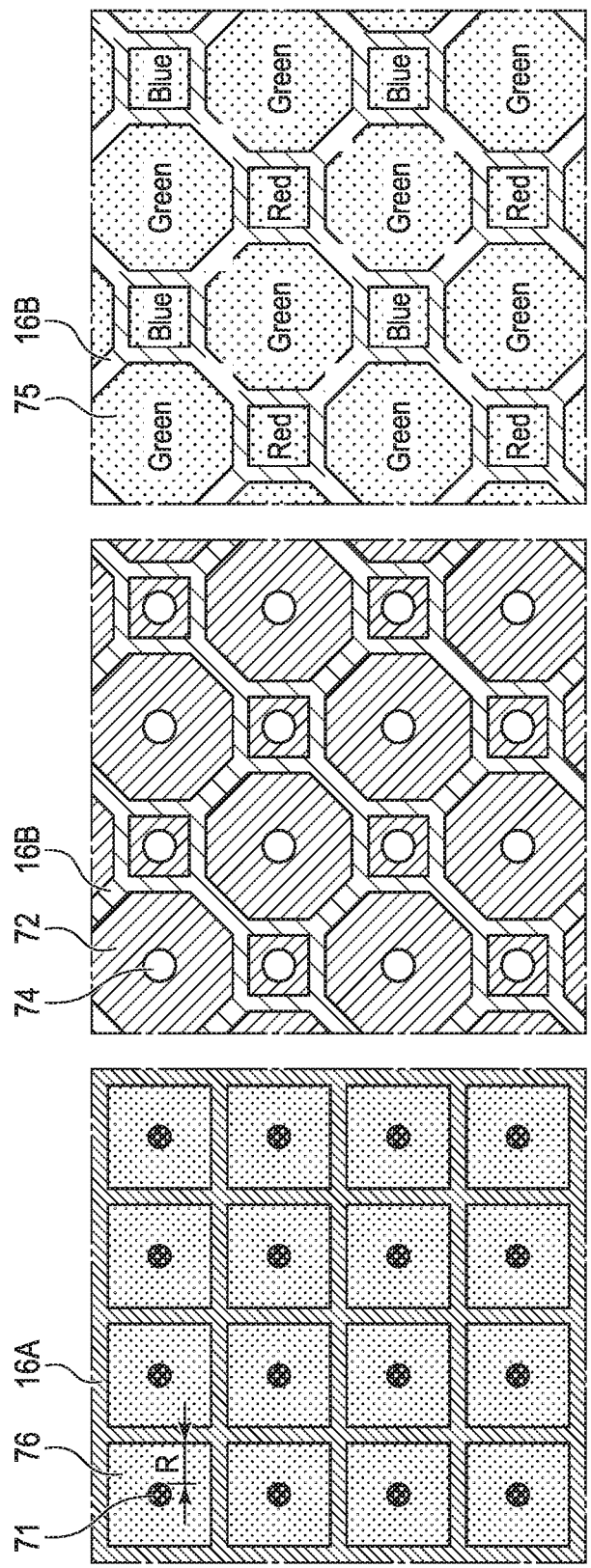

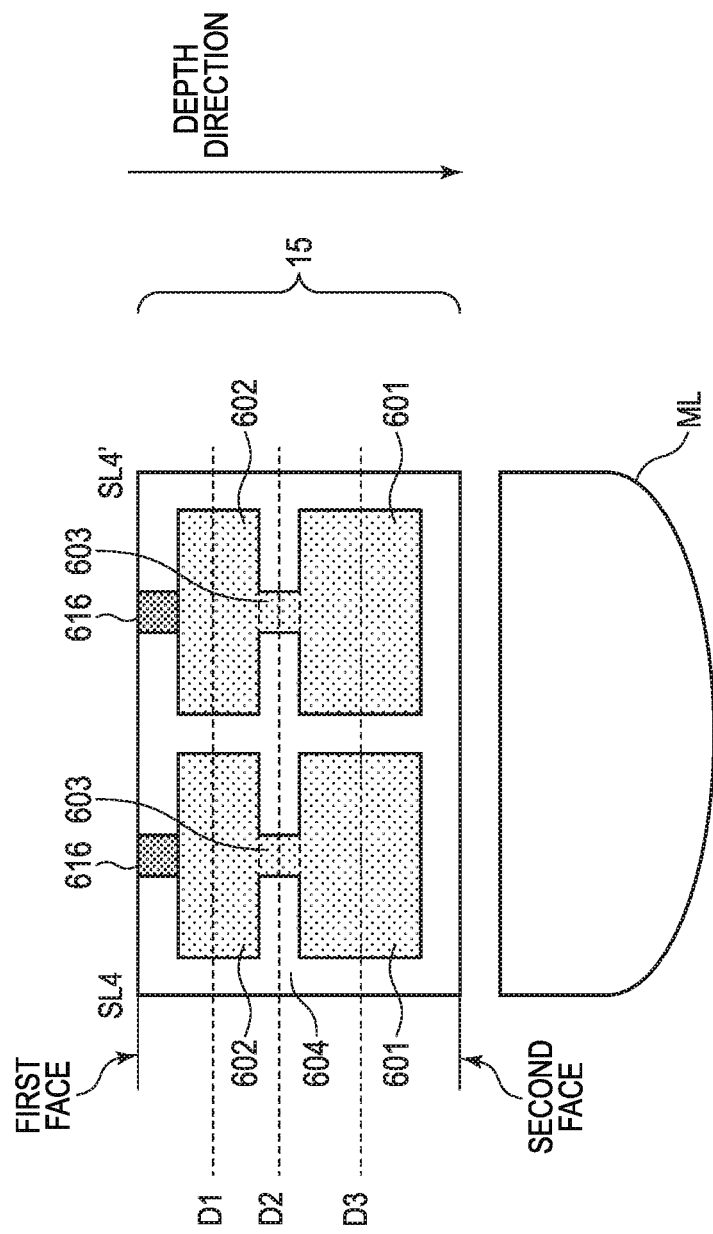

PHOTOELECTRIC CONVERSION DEVICE, IMAGING SYSTEM, AND MOBILE APPARATUS

This application is a continuation of U.S. application Ser. No. 17/339,231filed Jun. 4, 2021, which is a continuation of 16/780,666 filed Feb. 3, 2020 (now U.S. U.S. Pat. No. 11,056,519, issued on Jul. 6, 2021), the contents of which are incorporated by reference herein.

BACKGROUND OF THE INVENTION

This application claims the benefit of Japanese Patent Application No. 2019-031823, filed Feb. 25, 2019, and Japanese Patent Application No. 2019-212961, filed Nov. 26, 2019, which are hereby incorporated by reference herein in their entirety.

Field of the Invention

The present invention relates to a photoelectric conversion device, an imaging system, and a mobile apparatus.

Description of the Related Art

An avalanche diode that can detect a weak light at a single photon level by using avalanche (electronic avalanche) multiplication is known. Japanese Patent Application Laid-Open No. 2018-157387 discloses an imaging device configured such that a plurality of avalanche diodes is arranged in a single pixel.

Further, an image sensor having a plurality of photoelectric conversion units in each pixel for image plane phase difference autofocusing is known. In such an image sensor, when a subject having a stripe pattern or the like where a parallax is less likely to appear, the accuracy of autofocusing may decrease. Japanese Patent Application Laid-Open No. 2011-53519 discloses a technique to improve focus detection accuracy by using two alignment directions of focus detection pixels.

In a photoelectric conversion device using photodiodes as disclosed in Japanese Patent Application Laid-Open No. 2018-157387 or Japanese Patent Application Laid-Open No. 2011-53519, a desired function may differ in accordance with the position in the thickness direction of a semiconductor substrate in which photodiodes are formed. In both Japanese Patent Application Laid-Open No. 2018-157387 and Japanese Patent Application Laid-Open No. 2011-53519, however, there is no consideration in which a relationship between a position in the thickness direction of a substrate and a function is focused on.

SUMMARY OF THE INVENTION

The present invention intends to provide a photoelectric conversion device, an imaging system, and a mobile apparatus that may optimize the structure of photodiodes taking the position in the thickness direction of a substrate into consideration.

According to one aspect of the present invention, provided is a photoelectric conversion device including: a first substrate having a first face; a plurality of photodiodes arranged in the first substrate and each having a first region that generates signal charges by photoelectrically converting an incident light and a second region that receives the signal charges moving from the first region; a first isolation region arranged in the first substrate at a first depth and including a first portion extending in a first direction so as to isolate the second region of one of the plurality of photodiodes from the second region of another of the plurality of photodiodes; and a second isolation region arranged in the first substrate at a second depth deeper than the first depth with respect to the first face, and including a second portion extending in a second direction, which intersects the first direction in plan view, so as to isolate the first region of one of the plurality of photodiodes from the first region of another of the plurality of photodiodes, and a part of the first portion and a part of the second portion are overlapped with each other in plan view.

Further features of the present invention will become apparent from the following description of exemplary embodiments with reference to the attached drawings.

BRIEF DESCRIPTION OF THE DRAWINGS

FIG. 1 is a schematic sectional view of an avalanche diode according to a first embodiment.

FIG. 2A, FIG. 2B, and FIG. 2C are schematic plan views of the avalanche diode according to the first embodiment.

FIG. 4A, FIG. 4B, and FIG. 4C are schematic plan views illustrating an example of pixel arrangement.

FIG. 27 is a schematic sectional view of avalanche diodes according to an eighth embodiment.

DESCRIPTION OF THE EMBODIMENTS

Figure 3A:
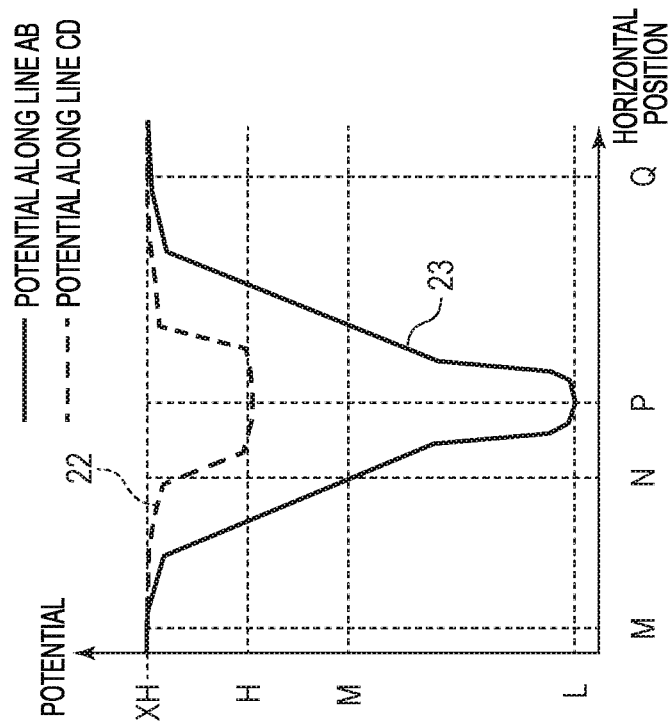
FIG. 3A and FIG. 3B are potential diagrams of the avalanche diode according to the first embodiment.

Preferred embodiments of the present invention will now be described in detail in accordance with the accompanying drawings.

First Embodiment

A photoelectric conversion device according to a first embodiment will be described. As one example, the photoelectric conversion device of the present embodiment is assumed to be an imaging device used for capturing an image. The photoelectric conversion device of the present embodiment has one or a plurality of pixels, and each pixel includes one or a plurality of avalanche diodes. The conductive type of a charge used as a signal charge out of a pair of charges generated by an avalanche diode is referred to as a first conductive type. Further, the conductive type opposite to the first conductive type is referred to as a second conductive type.

FIG. 1 is a schematic sectional view of an avalanche diode according to the present embodiment. The avalanche diode of the present embodiment is arranged in a semiconductor substrate 15 (first substrate). The semiconductor substrate 15 has a first face and a second face opposed to the first face. For example, the first face is a front face of the semiconductor substrate 15, and the second face is a back face of the semiconductor substrate 15. In the present embodiment, a direction from the first face to the second face is referred to as a depth direction. On the front face side of the semiconductor substrate 15, gate electrodes of transistors, a multi-layer wiring structure, and the like are arranged.

Each of isolation portions 16A and 16B is a region that electrically isolates semiconductor regions from each other. Each of the isolation portions 16A and 16B may be an insulating isolation region formed by local oxidation of silicon (LOCOS), shallow trench isolation (STI), deep trench isolation (DTI), or the like. Further, each of the isolation portions 16A and 16B may be a PN isolation region formed by PN junction between a P-type semiconductor region and an N-type semiconductor region.

As illustrated in FIG. 1, a region surrounded by the isolation portion 16A that functions as a first isolation region is formed in the semiconductor substrate 15. A first semiconductor region 71 of the first conductive type and a second semiconductor region 76 are arranged in a region surrounded by the isolation portion 16A. Furthermore, a region surrounded by the isolation portion 16B that functions as a second isolation region is formed in the semiconductor substrate 15. A third semiconductor region 74, a fourth semiconductor region 72 of the second conductive type, and a fifth semiconductor region 75 are arranged in the region surrounded by the isolation portion 16B. Further, contact plugs 77 arranged in contact with the first semiconductor region 71 are provided on the first face of the semiconductor substrate 15. The contact plug 77 functions as a terminal of the avalanche diode.

The first semiconductor region 71, the second semiconductor region 76, and the isolation portion 16A are arranged at the depth X (first depth). The first semiconductor region 71 and the second semiconductor region 76 are in contact with each other in a direction (the horizontal direction in FIG. 1) perpendicular to the depth direction. The second semiconductor region 76 is arranged between the first semiconductor region 71 and the isolation portion 16A.

Herein, the expression that the first semiconductor region 71, the second semiconductor region 76, and the isolation portion 16A are arranged at the depth X means that a region having the highest (peak) impurity concentration injected inside the semiconductor substrate 15 is at the depth X, for example. However, this does not mean that the peak is the same as the depth X in a strict sense, and a case where the peak is shifted from the depth X by a design error, a manufacturing error, or the like is also included in the state where the peak is arranged at the depth X.

The third semiconductor region 74 and the fourth semiconductor region 72 are arranged at a depth Y that is deeper than the depth X with respect to the first face. The fifth semiconductor region 75 is arranged at a depth Z (second depth) that is deeper than the depth Y with respect to the first face. The isolation portion 16B is arranged at the depth Y and the depth Z. The third semiconductor region 74 and the fourth semiconductor region 72 are in contact with each other in a direction perpendicular to the depth direction. The fourth semiconductor region 72 is arranged between the third semiconductor region 74 and the isolation portion 16B. The fifth semiconductor region 75 and the isolation portion 16B are in contact with each other in a direction perpendicular to the depth direction.

FIG. 2A, FIG. 2B, and FIG. 2C are schematic plan views of the avalanche diode according to the present embodiment. FIG. 2A, FIG. 2B, and FIG. 2C illustrate schematic plan views at the depth X, the depth Y, and the depth Z, respectively.

As illustrated in FIG. 2A, the first semiconductor region 71 is contained in the second semiconductor region 76 at the depth X. Further, the second semiconductor region 76 is contained in the isolation portion 16A. Note that a distance R in FIG. 2A indicates the distance between the first semiconductor region 71 and the isolation portion 16A.

As illustrated in FIG. 2B, the third semiconductor region 74 is contained in the fourth semiconductor region 72 at the depth Y. Further, the fourth semiconductor region 72 is contained in the isolation portion 16B. As illustrated in FIG. 2C, the fifth semiconductor region 75 is contained in the isolation portion 16B at the depth Z.

As illustrated in FIG. 1, FIG. 2A, FIG. 2B, and FIG. 2C, the first semiconductor region 71 overlaps at least a part of the third semiconductor region 74 in plan view. Further, the third semiconductor region 74 and the fourth semiconductor region 72 overlap at least a part of the fifth semiconductor region 75 in plan view. Furthermore, the second semiconductor region 76 overlaps at least a part of the fourth semiconductor region 72 in plan view. Here, the shape of the isolation portion 16A and the shape of the isolation portion 16B are different from each other in plan view.

Figure 3B:
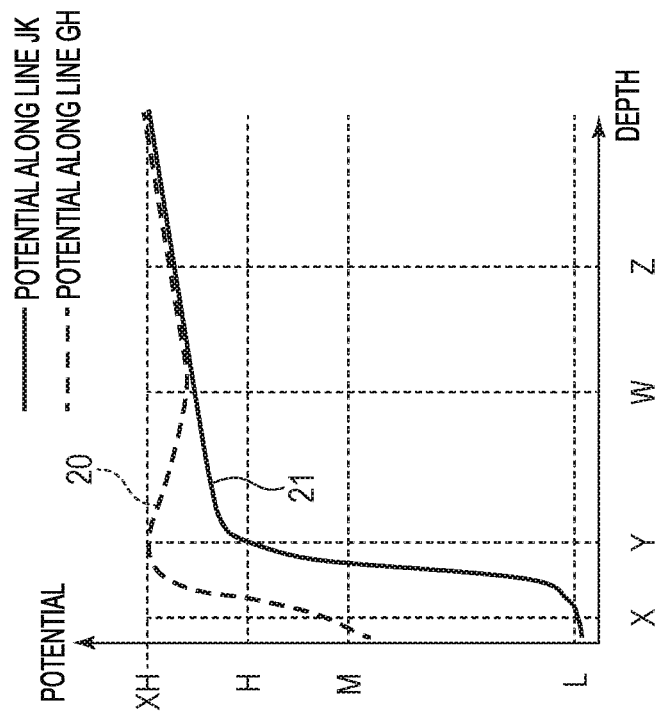

FIG. 3A and FIG. 3B are graphs illustrating one example of the potential of the avalanche diode according to the present embodiment. FIG. 3A illustrates the potential distributions along a line JK and a line GH of the sectional view illustrated in FIG. 1. FIG. 3B illustrates the potential distributions along a line AB and a line CD of the sectional view illustrated in FIG. 1. The potential inside a semiconductor region changes in accordance with an electric potential applied to the contact plug 77. The potentials illustrated in FIG. 3A and FIG. 3B are potentials when an electric potential is supplied so that a reverse bias voltage is applied to the avalanche diode. This electric potential is supplied from a power source voltage line provided outside the avalanche diode via a circuit such as a quench circuit. Further, the level of the electric potential is set so that avalanche multiplication occurs in the avalanche diode.

In FIG. 3A, the dashed line 20 represents the potential distribution along the line GH, and the solid line 21 represents the potential distribution along the line JK. Each of these potentials indicates the potential for an electron that is a signal charge. Note that, when a signal charge is a hole, the relationship of the higher potential and the lower potential will be opposite. The depths X, Y, Z, and W on the horizontal axis correspond to the depths at positions labeled with the corresponding references illustrated in FIG. 1. That is, the references X, Y, and Z in FIG. 3A denote the depth X, the depth Y, and the depth Z illustrated in FIG. 1, respectively. Further, the depth W is a depth between the depth Y and the depth Z.

Each level of the potential in FIG. 3A will be described. The XH level denotes the potential of the fourth semiconductor region 72. The H level denotes the potential of the third semiconductor region 74. The M level denotes the potential of the second semiconductor region 76. The L level denotes the potential of the first semiconductor region 71. Note that, although the potential of the second semiconductor region 76 is lower than the potential of the third semiconductor region 74 in this example, this may be opposite. Further, although the potential of the third semiconductor region 74 is lower than the potential of the fourth semiconductor region 72 in this example, these potentials may be the same. Further, although the potential of the first semiconductor region 71 is lower than the potential of the second semiconductor region 76 in this example, these potentials may be the same.

The potential along the line GH represented by the dashed line 20 will be described. The potential is between the XH level and the H level at the depth Z. The potential gradually decreases as the depth changes from the depth Z to the depth W. The potential then gradually increases as the depth changes from the depth W to the depth Y and reaches the XH level at the depth Y. Furthermore, the potential gradually decreases as the depth changes from the depth Y to the depth X. The potential reaches the M level near the depth X.

The potential along the line JK represented by the solid line 21 passing through the avalanche diode will be described. The potential is between the XH level and the H level at the depth Z. The potential gradually decreases as the depth changes from the depth Z to the depth Y, and the slope of the potential increases near the depth Y. The potential then reaches the H level at the depth Y. The potential sharply decreases as the depth changes from the depth Y to the depth X. That is, a steep potential gradient is formed between the depth Y and the depth X. The potential reaches the L level at the depth X.

The potentials along the line GH and the line JK are substantially the same at the depth Z. Further, a potential gradient that gradually decreases as the depth approaches the first face side of the semiconductor substrate 15 is formed at the position along the line GH and the line JK near the depth Z. Thus, charges generated in a semiconductor region inside the pixel by an incident light move toward the first face side due to this potential gradient.

Along the line JK, a potential gradient that slightly decreases as the depth approaches the first face side of the semiconductor substrate 15 as the depth changes from the depth W to the depth Y is formed. Thereby, charges move toward the first face side. On the other hand, a potential gradient that slightly increases as the depth approaches the first face side of the semiconductor substrate 15 as the depth changes from the depth W to the depth Y is formed along the line GH. This potential gradient serves as a potential barrier against charges moving toward the first face. This potential barrier (the fourth semiconductor region 72) suppresses charges from moving from the fifth semiconductor region 75 to the second semiconductor region 76. In contrast, since the potential gradient in the horizontal direction from the position on the line GH to the line JK is small, charges located near the line GH are facilitated to move to a part near the line JK in the course of moving toward the first face in the range from the depth W to the depth Y.

Charges that have moved to a part near the region represented by the line JK are accelerated by a steep potential gradient, that is, an intense electric field formed over the range from the depth Y to the depth X. Charges accelerated by the intense electric field reach the first semiconductor region 71. In such a way, avalanche multiplication occurs in the region from the depth Y to the depth X near the line JK. In contrast, the region represented by the line GH has a potential distribution by which avalanche multiplication is less likely to occur than the region from the depth Y to the depth X along the line JK.

One example that realizes such structure may be a configuration in which the difference between the potential of the first semiconductor region 71 and the potential of the third semiconductor region 74 is larger than the difference between the potential of the second semiconductor region 76 and the potential of the fourth semiconductor region 72. With such potential structure, the configuration by which avalanche multiplication occurs in the avalanche diode is realized. Further, in this configuration, reduction in sensitivity due to the presence of a portion in which avalanche multiplication is less likely to occur is reduced for the following reason.

The potential of the third semiconductor region 74 is lower than the potential of the fourth semiconductor region 72. Thus, the fourth semiconductor region 72 functions as a potential barrier against signal charges present in the fifth semiconductor region 75. Accordingly, signal charges present in a region which is included in the fifth semiconductor region 75 and overlaps the fourth semiconductor region 72 or the third semiconductor region 74 are facilitated to move to the first semiconductor region 71 via the third semiconductor region 74 and charges are collected, and thus reduction in sensitivity is reduced.

FIG. 3A illustrates the potential structure when the third semiconductor region 74 is a P-type semiconductor region. Even when the third semiconductor region 74 is a N-type semiconductor region, however, the relationship of the potentials at the depth Y does not change for the line GH and the line JK, respectively. That is, at the depth Y, the potential along the line GH is higher than the potential along the line JK.

Further, while FIG. 3A illustrates the potential structure when the second semiconductor region 76 is an N-type semiconductor region, the relationship of the potentials at the depth Y does not change for the line GH and the line JK, respectively even in the case of a P-type semiconductor region. That is, at the depth Y, the potential along the line GH is higher than the potential along the line JK.

Note that, since charges generated in each portion of the fifth semiconductor region 75 move to a part near the region represented by the line JK and cause avalanche multiplication, the sensitivity of a single pixel is approximately proportional to the area in plan view of the fifth semiconductor region 75 contained in the isolation portion 16B.

In FIG. 3B, the dashed line 22 represents the potential distribution along the line CD, that is, at the depth Y, and the solid line 23 represents the potential distribution along the line AB, that is, at the depth X. Since the meanings of the XH level, the H level, the M level, and the L level are the same as those in FIG. 3A, the description thereof will be omitted.

The potential represented by the dashed line 22 changes between the XH level and the H level in accordance with the horizontal position. The potential is low near the third semiconductor region 74. The potential represented by the solid line 23 changes between the XH level and the L level in accordance with the horizontal position. More specifically, the distribution is such that the potential gradually decreases as the horizontal position changes from the isolation portion 16A to the first semiconductor region 71. The potential of the second semiconductor region 76 located between the isolation portion 16A and the first semiconductor region 71 slightly changes from the isolation portion 16A to the first semiconductor region 71. This potential distribution may be realized by injecting impurities so that the impurity concentration of the second semiconductor region 76 is relatively low.

In the present embodiment, with the second semiconductor region 76 being arranged between the isolation portion 16A and the first semiconductor region 71, the isolation portion 16A and the first semiconductor region 71 are spaced apart from each other by the constant distance R. Accordingly, the intensity of the electric field due to the difference between the potential of the isolation portion 16A and the potential of the first semiconductor region 71 can be lower than the intensity of the electric field due to the difference between the potential of the first semiconductor region 71 and the potential of the third semiconductor region 74. Therefore, this suppresses a situation that noise due to a tunnel effect is caused by avalanche multiplication occurring at PN junction between the isolation portion 16A and the first semiconductor region 71.

As described above, the isolation portion 16A arranged at the depth X defines an avalanche region (second region) in which avalanche multiplication due to signal charges occurs. Further, the isolation portion 16B arranged at the depth Z defines a sensitivity region (first region) in which signal charges are generated by photoelectric conversion of an incident light. As described above, in terms of reduction of noise due to a tunnel effect, the isolation portion 16A at the depth X is designed so as to secure the distance R between the isolation portion 16A and the first semiconductor region 71 to some degrees. In contrast, the isolation portion 16B at the depth Z is designed by adjusting the shape, the area, or the like so as to have a desired position and a desired level of sensitivity of the sensitivity region of each pixel. As discussed above, since the shape of an avalanche region and the shape of a sensitivity region have different design constraints, different shapes may be optimal for respective shapes. Accordingly, in the present embodiment, the shape of the isolation portion 16A and the shape of the isolation portion 16B are different from each other in plan view. Thus, a photoelectric conversion device with improved flexibility of layout is provided, and the shape of an avalanche region and the shape of a sensitivity region can be designed to be the shapes suitable for respective natures.

As one example of the configuration in which the shape of the isolation portion 16A and the shape of the isolation portion 16B are different from each other, the area contained in the isolation portion 16A and the area contained in the isolation portion 16B may differ from each other. For example, for a pixel intended to increase sensitivity, the area contained in the isolation portion 16B may be designed to be larger than the area contained in the isolation portion 16A, and thereby the isolation portion 16B may be arranged to overlap a part of an adjacent pixel. In the avalanche diode of the present embodiment, signal charges present in the fifth semiconductor region 75 easily move to the first semiconductor region 71 via the third semiconductor region 74, as described above. Therefore, since signal charges generated in the fifth semiconductor region 75 are collected to the first semiconductor region 71, avalanche multiplication similarly occurs even when the area contained in the isolation portion 16B is designed to be larger than the area contained in the isolation portion 16A. FIG. 4A, FIG. 4B, and FIG. 4C illustrate an example of a configuration in which the area contained in the isolation portion 16B of some of the pixels is increased.

FIG. 4A, FIG. 4B, and FIG. 4C are schematic plan views illustrating an example of pixel arrangement in which the area contained in the isolation portion 16B is larger than the area contained in the isolation portion 16A in some of the pixels. FIG. 4A is a schematic plan view at the depth X, FIG. 4B is a schematic plan view at the depth Y, and FIG. 4C is a schematic plan view at the depth Z. As illustrated in FIG. 4A, FIG. 4B, and FIG. 4C, the plurality of pixels arranged in the semiconductor substrate 15 is arranged to form a plurality of rows and a plurality of columns. In FIG. 4A, FIG. 4B, and FIG. 4C, four rows by four columns out of the plurality of pixels are extracted and illustrated.

As illustrated in FIG. 4A, the first semiconductor region 71 is contained in the second semiconductor region 76 at the depth X. Further, the second semiconductor region 76 is contained in the isolation portion 16A. The minimum distance between the first semiconductor region 71 and the isolation portion 16A is the distance R in all the pixels.

As illustrated in FIG. 4B, the third semiconductor region 74 is contained in the fourth semiconductor region 72 at the depth Y. Further, the fourth semiconductor region 72 is contained in the isolation portion 16B. As illustrated in FIG. 4C, the fifth semiconductor region 75 is contained in the isolation portion 16B at the depth Z. The characters "Red", "Green", and "Blue" written in the fifth semiconductor region 75 of FIG. 4C indicate that corresponding pixels are a red pixel, the green pixel, and a blue pixel, respectively. The red pixel, the green pixel, and the blue pixel are pixels on which a red color filter, a green color filter, and a blue color filter are provided, respectively. In the present embodiment, red pixels, green pixels, and blue pixels form the Bayer arrangement.

As illustrated in FIG. 4C, the area contained the isolation portion 16B of the green pixel is larger than those of pixels of other colors in the present embodiment. To realize this, the isolation portion 16B of a green pixel is arranged to exceed outside with respect to the isolation portion 16A between an adjacent red pixel and an adjacent blue pixel in plan view. In other words, the shape of the isolation portion 16A and the shape of the isolation portion 16B are different from each other in plan view. Thereby, the area of the sensitivity region of a green pixel can be wider than the area of the sensitivity region of pixels of other colors, and the sensitivity of a green pixel can be larger. Since human eyes are more sensitive to green than to red or blue, the substantial image quality is improved when the area of the sensitivity region of a green pixel is larger than the area of the sensitivity region of a red pixel or a blue pixel, as illustrated in FIG. 4C.

Note that, for some design requirement, a color pixel other than a green pixel may be larger. That is, in other words in a more general manner, with respect to two avalanche diodes included in the photoelectric conversion device, the areas of sensitivity regions surrounded by the isolation portion 16B may be different from each other. Further, the two avalanche diodes can be reworded as a first avalanche diode having sensitivity to an incident light of a first color and a second avalanche diode having sensitivity to an incident light of a second color that is different from the first color.

Figure 5B:
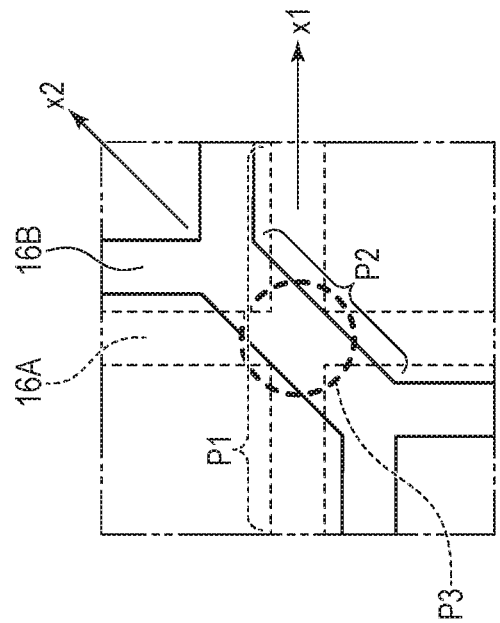
FIG. 5A and FIG. 5B are schematic plan views in which isolation portions are overlapped for illustration.
Figure 5A:
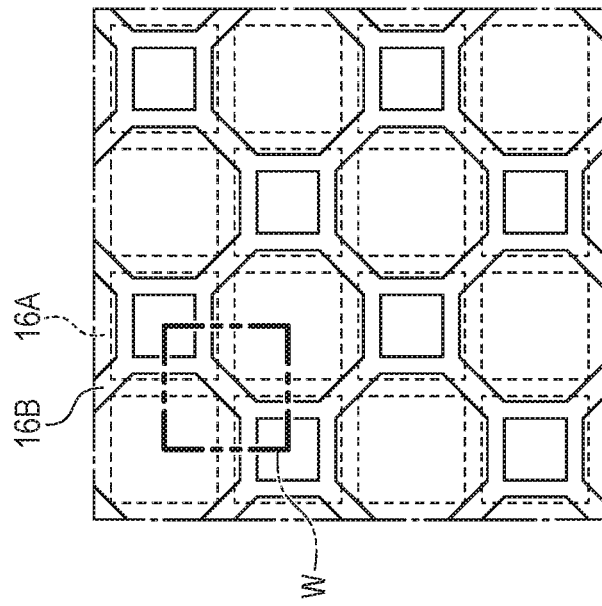

With reference to FIG. 5A and FIG. 5B, the positional relationship between the isolation portion 16A and the isolation portion 16B will be described in more detail. FIG. 5A is a schematic plan view in which the isolation portion 16A of FIG. 4A and the isolation portion 16B of FIG. 4B are overlapped for illustration. FIG. 5B is an enlarged view of an intersection part W of the isolation portion 16A and the isolation portion 16B. As illustrated in FIG. 5B, the isolation portion 16A includes a first portion P1 extending in the x1 direction (first direction). Further, the isolation portion 16B includes a second portion P2 extending in the x2 direction (second direction) intersecting the x1 direction in plan view. In this case, a part of the first portion P1 and a part of the second portion P2 are overlapped with each other in an overlapped part P3 in plan view.

As described above, according to the present embodiment, the shape of the isolation portion 16A that isolates avalanche regions from each other and the shape of the isolation portion 16B that isolates sensitivity regions from each other are different from each other in plan view. More specifically, a part of the first portion P1 of the isolation portion 16A and a part of the second portion P2 of the isolation portion 16B are overlapped with each other in the overlapped part P3 in plan view. Accordingly, a photoelectric conversion device with improved flexibility of layout is provided.

Further, according to the present embodiment, the fourth semiconductor region 72 that functions as the third isolation region is arranged so as to isolate a part of a region between an avalanche region and a sensitivity region. Accordingly, since signal charges present in the fifth semiconductor region 75 are facilitated to move to the first semiconductor region 71 via the third semiconductor region 74, the sensitivity is improved.

Although a bias voltage applied to an avalanche diode is controlled to have a state where avalanche multiplication occurs in the description of the present embodiment, without being limited thereto, the bias voltage may be controllable to have a state where no avalanche multiplication occurs. In other words, the avalanche diode of the present embodiment may be operable in two types of modes: an accumulation mode to accumulate signal charges in the sensitivity region and a readout mode to read out signal charges accumulated in the sensitivity region. Here, the accumulation mode is a mode in which a first bias voltage is applied to an avalanche diode, which is controlled to a state where no avalanche multiplication occurs. Charges generated by photoelectric conversion when the avalanche diode is in the accumulation mode are accumulated in the sensitivity region. The readout mode is a mode in which a second bias voltage that is different from the first bias voltage is applied to an avalanche diode, which is controlled to a state where avalanche multiplication occurs. With an avalanche diode being controlled in two types of modes in such a way, an operation to accumulate signal charges in a sensitivity region for a predetermined period and then read out a signal in accordance with signal charges accumulated within the predetermined period can be realized.

Second Embodiment

A photoelectric conversion device according to a second embodiment will be described. In description of the present embodiment, features having the same function as those of the first embodiment will be labeled with the same references, and detailed description thereof may be omitted or simplified.

Figure 6:
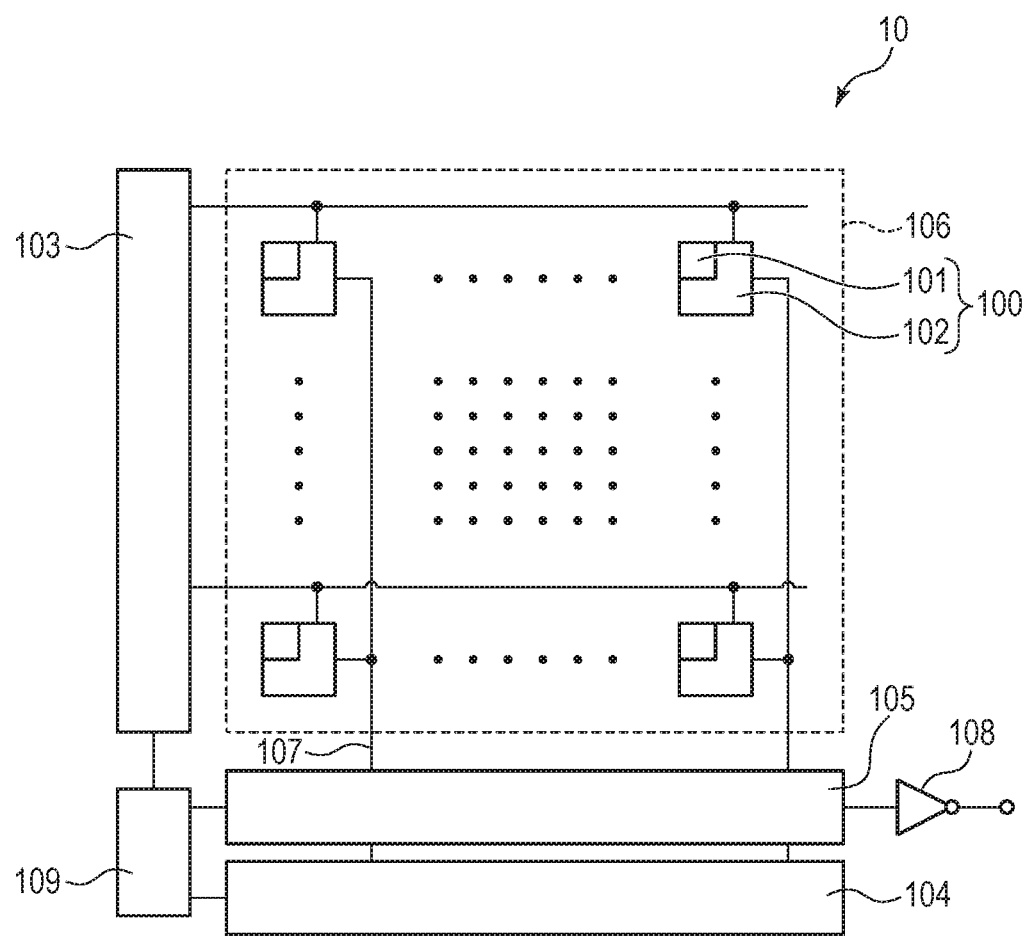
FIG. 6 is a block diagram of a photoelectric conversion device according to a second embodiment.

FIG. 6 is a block diagram of a photoelectric conversion device 10 according to the present embodiment. The photoelectric conversion device 10 has a pixel unit 106, a control pulse generation unit 109, a horizontal scanning circuit 104, a column circuit 105, signal lines 107, an output circuit 108, and a vertical scanning circuit 103.

The pixel unit 106 has a plurality of pixels 100 arranged to form a plurality of rows and a plurality of columns. Each of the pixels 100 includes a photoelectric conversion element 101 and a pixel signal processing unit 102. The photoelectric conversion element 101 converts a light entering the photoelectric conversion device 10 into an electrical signal. The pixel signal processing unit 102 outputs the electrical signal to the column circuit 105 via the signal line 107.

The vertical scanning circuit 103 supplies control pulses used for driving respective pixels 100 on a pixel row basis based on control pulses supplied from the control pulse generation unit 109. A logic circuit such as a shift register, an address decoder, or the like may be used for the vertical scanning circuit 103. The signal lines 107 are arranged for each column of the pixel unit 106. The signal line 107 transmits, to the column circuit 105, a signal output from the pixels 100 selected by the vertical scanning circuit 103.

Signals of respective pixels 100 are input to the column circuit 105 via the signal lines 107. The column circuit 105 performs a predetermined process on input signals. The predetermined process may include a process of noise removal, amplification, or the like on an input signal and a process of converting a processed signal into a form to be externally output. To implement this function, the column circuit 105 has a parallel-to-serial converter circuit, for example.

The horizontal scanning circuit 104 supplies, to the column circuit 105, control pulses used for outputting signals processed in the column circuit 105 to the output circuit 108 sequentially on a column basis. The output circuit 108 is formed of a buffer amplifier, a differential amplifier, or the like. The output circuit 108 outputs, to a storage unit or a signal processing unit outside the photoelectric conversion device 10, a signal output from the column circuit 105.

Although the arrangement of the pixels 100 in the pixel unit 106 is a two-dimensional matrix in FIG. 6, the arrangement is not limited thereto. For example, in the pixel unit 106, a plurality of pixels 100 may be arranged one-dimensionally. Further, only a single pixel 100 may be included in the pixel unit 106. Further, the vertical scanning circuit 103, the horizontal scanning circuit 104, and the column circuit 105 may be divided into a plurality of blocks, and blocks of the pixel unit 106 may be arranged so as to correspond to the blocks described above of the vertical scanning circuit 103, the horizontal scanning circuit 104, and the column circuit 105. Further, the horizontal scanning circuit 104 and the column circuit 105 may be divided into blocks corresponding to respective pixel columns.

It is not essential that the function of the pixel signal processing unit 102 be provided in each one of all the pixels 100 within the pixel unit 106, and a single pixel signal processing unit 102 may be shared by a plurality of pixels 100, for example. In such a case, the pixel signal processing unit 102 performs a process sequentially on signals output from the plurality of pixels 100.

Further, in FIG. 6, the semiconductor substrate 15 including a pixel array in which the photoelectric conversion elements 101 are arranged two-dimensionally and a semiconductor substrate including elements other than the above may be separate semiconductor substrates. Thereby, a ratio of the area of the photoelectric conversion elements 101 to the chip area can be increased, and the sensitivity of the photoelectric conversion elements 101 is improved. In such a case, the photoelectric conversion device 10 may have a stacked structure in which a plurality of semiconductor substrates is attached to each other.

As one example of such a configuration, the pixel signal processing units 102 may be provided on a semiconductor substrate that is different from the semiconductor substrate 15 in which the photoelectric conversion elements 101 are formed. In such a case, the photoelectric conversion elements 101 and the pixel signal processing units 102 are electrically connected to each other via connection wirings provided for each pixel 100. The vertical scanning circuit 103, the horizontal scanning circuit 104, the signal lines 107, and the column circuit 105 may be similarly provided on different semiconductor substrate from the photoelectric conversion elements 101, and the same advantage is obtained.

Figure 7:
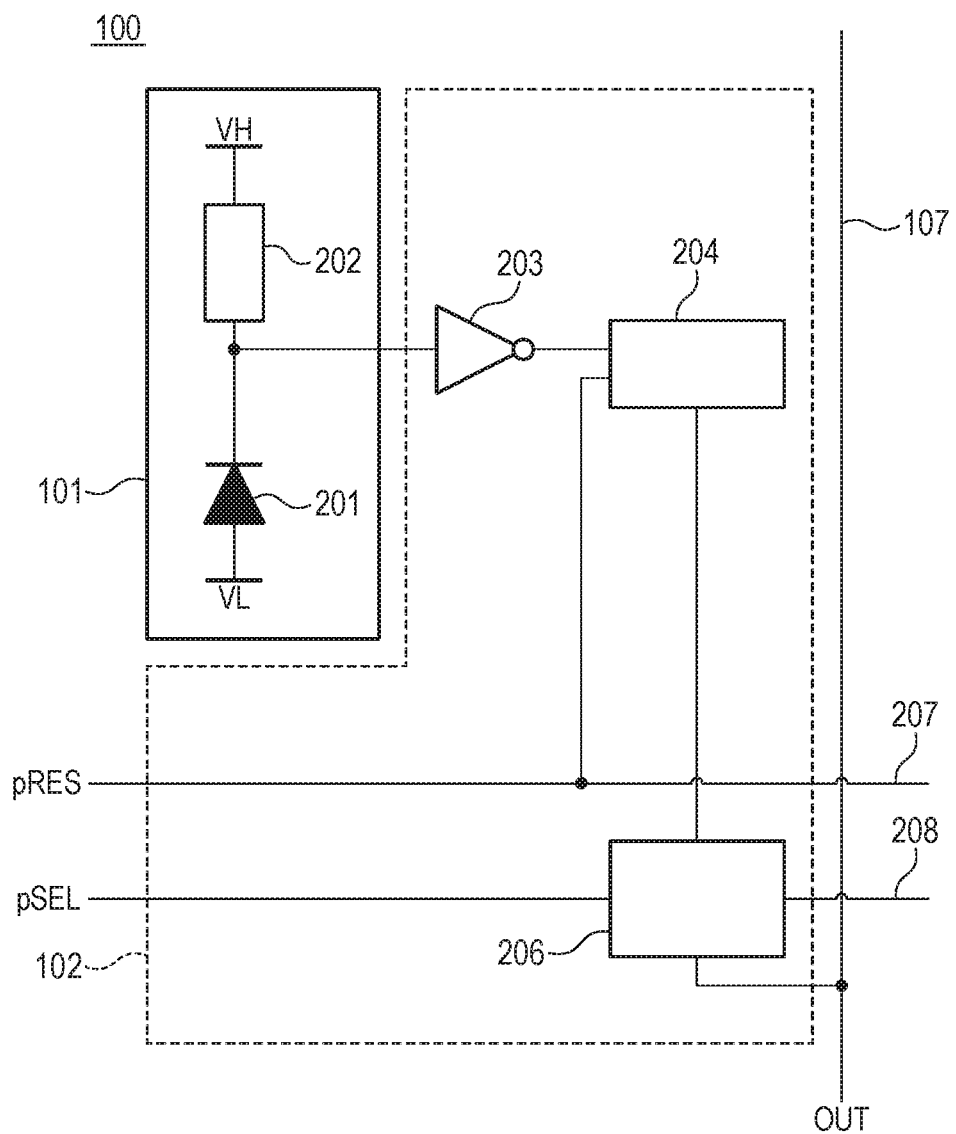
FIG. 7 is a block diagram of a pixel according to the second embodiment.

FIG. 7 is one example of a block diagram of the pixel 100 according to the present embodiment. In FIG. 7, one pixel 100 has the photoelectric conversion element 101 and the pixel signal processing unit 102. The photoelectric conversion element 101 has a photoelectric conversion unit 201 and a control unit 202.

The photoelectric conversion unit 201 generates charge pairs by photoelectric conversion in accordance with an incident light. An avalanche diode is used as the photoelectric conversion unit 201. The anode of the photoelectric conversion unit 201 is connected to an electric potential line through which an electric potential VL is supplied. The cathode of the photoelectric conversion unit 201 is connected to one end of the control unit 202. The other end of the control unit 202 is connected to an electric potential line through which an electric potential VH that is higher than the electric potential VL is supplied.

With such a configuration, an electric potential of a revers bias which may cause avalanche multiplication is applied between the anode and the cathode of the photoelectric conversion unit 201. Once photoelectric conversion is performed in response to an incident light with such an electric potential of a reverse bias being applied, generated charges cause avalanche multiplication, and an avalanche current occurs.

Note that, when an electric potential of a reverse bias is supplied to the photoelectric conversion unit 201 and an electric potential difference between the anode and the cathode is larger than the breakdown voltage, the avalanche diode is in a Geiger mode operation. A photodiode that fast detects a weak signal at a single photon level by using the Geiger mode operation is a single photon avalanche diode (SPAD).

Further, when the electric potential difference between the anode and the cathode of the photoelectric conversion unit 201 is greater than or equal to an electric potential difference by which charges generated in the photoelectric conversion unit 201 cause avalanche multiplication and is less than or equal to the breakdown voltage, the avalanche diode is in a linear mode. An avalanche diode that performs photo-detection in a linear mode is referred to as an avalanche photodiode (APD). In the present embodiment, the photoelectric conversion unit 201 may operate as any of the above avalanche diodes. Note that the electric potential difference that causes avalanche multiplication is approximately 6 V or greater.

The control unit 202 has a function of replacing a change in an avalanche current generated in the photoelectric conversion unit 201 with a voltage signal. Furthermore, the control unit 202 functions as a load circuit (quench circuit) at the time of signal amplification by avalanche multiplication. This load circuit performs a quench operation to change a voltage supplied to the photoelectric conversion unit 201 and suppress avalanche multiplication. The control unit 202 may include a resister element or an active quench circuit, for example. The active quench circuit is a circuit that actively suppresses avalanche multiplication by detecting an increase in the avalanche current and performing feedback control.

The pixel signal processing unit 102 has a waveform shaping unit 203, a counter circuit 204, and a selector circuit 206. The waveform shaping unit 203 shapes voltage change due to a signal of a single photon level and outputs a pulse signal. This pulse signal indicates incidence of a photon. For example, an inverter circuit is used for the waveform shaping unit 203, as illustrated in FIG. 7. Although FIG. 7 illustrates the example using a single inverter as the waveform shaping unit 203, the waveform shaping unit 203 may be a circuit in which a plurality of inverters is connected in series or may be another circuit as long as the circuit has a waveform shaping effect.

A pulse signal output from the waveform shaping unit 203 is counted by the counter circuit 204. For example, an N-bit counter (N is a positive integer) is provided in the counter circuit 204, and the N-bit counter can count an input pulse signal up to around the N-th power of 2 at most and hold the counted value. A signal obtained by counting is held in the counter circuit 204 as a signal indicating a detection result of an incident light. Further, a control pulse pRES is supplied from the vertical scanning circuit 103 to the counter circuit 204 via a drive line 207. The counter circuit 204 resets the held signal in response to the control pulse pRES being input.

A control pulse pSEL is supplied from the vertical scanning circuit 103 to the selector circuit 206 via a drive line 208. The selector circuit 206 switches electrical connection or disconnection between the counter circuit 204 and the signal line 107 based on the control pulse pSEL. For example, a transistor, a buffer circuit used for outputting a signal to the outside of the pixel, or the like may be used for the selector circuit 206.

When the pixel unit 106 has a configuration in which the plurality of pixels 100 is arranged in a matrix, a capturing operation may be a rolling shutter operation or a global electronic shutter operation. For example, a rolling shutter operation is realized by resetting values counted by the counter circuit 204 sequentially on a row basis and outputting signals held in the counter circuit 204 sequentially on a row basis.

Further, a global electronic shutter operation is realized by simultaneously resetting values counted by the counter circuits 204 on all the pixel rows and outputting signals held by the counter circuit 204 sequentially on a row basis. Note that, when the global electronic shutter operation is applied, it is desirable to provide a switching member using a switch or the like so as to be able to switch whether or not to perform counting by the counter circuit 204.

Figure 8:
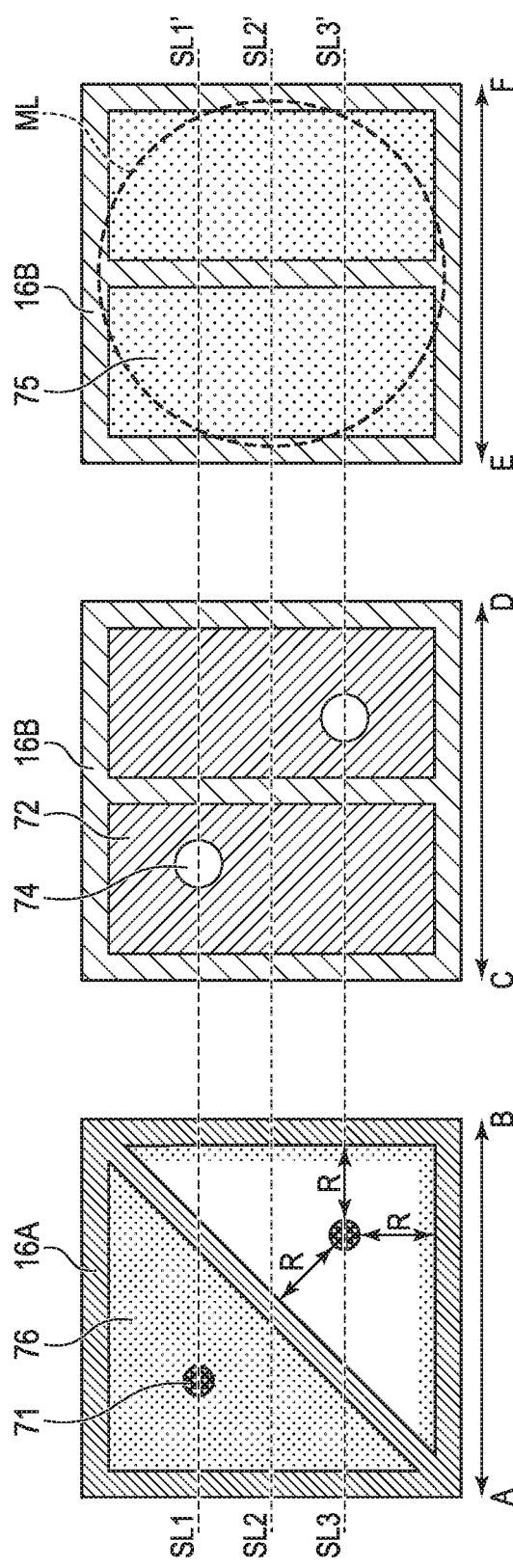
FIG. 8A, FIG. 8B, FIG. 8C, FIG. 8D, FIG. 8E, and FIG. 8F are schematic plan views and schematic sectional views of avalanche diodes according to the second embodiment.

FIG. 8A to FIG. 8F are schematic plan views and schematic sectional views illustrating an example of a configuration in which two avalanche diodes of FIG. 6 and FIG. 7 are arranged diagonally inside a substantially square region. The plurality of avalanche diodes of the photoelectric conversion device 10 is arranged in a matrix in which a plurality of rows and a plurality of columns are formed, where the two avalanche diodes illustrated in FIG. 8A to FIG. 8F are defined as one unit. FIG. 8A is a schematic plan view at the depth X, FIG. 8B is a schematic plan view at the depth Y, and FIG. 8C is a schematic plan view at the depth Z. Further, FIG. 8D is a schematic sectional view taken along a line SL1-SL1', FIG. 8E is a schematic sectional view taken along a line SL2-SL2', and FIG. 8F is a schematic sectional view taken along a line SL3-SL3'.

As illustrated in FIG. 8A, two first semiconductor regions 71 are contained in two second semiconductor regions 76 at the depth X, respectively. Further, the two second semiconductor regions 76 are contained in different portions of the isolation portion 16A, respectively. The first semiconductor regions 71 and the isolation portion 16A are arranged so that the distance between the first semiconductor regions 71 and the isolation portion 16A is the distance R in all the directions. In other words, the first semiconductor regions 71 are arranged so that the distance between the first semiconductor regions 71 and the isolation portion 16A is the largest. The two first semiconductor regions 71 are arranged on a diagonal line of a square formed by the isolation portion 16A. The isolation portion 16A is arranged extending in a diagonal direction (a direction that is different from any of the row and the column formed by the avalanche diode) between the two first semiconductor regions 71 so as to isolate diagonally the two second semiconductor regions 76. In such a way, when two avalanche diodes are arranged in a square region, it is possible to increase the distance R by arranging the first semiconductor regions 71 on a diagonal line. Thereby, the distance R can be larger by around 1.17 times than that in the case where the two first semiconductor regions 71 are arranged in the horizontal direction.

As illustrated in FIG. 8B, each third semiconductor region 74 is contained in each fourth semiconductor region 72 at the depth Y. Further, the fourth semiconductor regions 72 are contained in the isolation portion 16B.

As illustrated in FIG. 8C, two fifth semiconductor regions 75 are contained in different portions of the isolation portion 16B at the depth Z, respectively. The isolation portion 16B is arranged extending in the vertical direction between the two fifth semiconductor region 75 so as to isolate the two second semiconductor regions 76 from each other in the horizontal direction. Further, in FIG. 8C, the position of a micro-lens ML that guides an incident light to the two fifth semiconductor regions 75 is depicted by a dashed line. The positions of the two fifth semiconductor regions 75 are arranged symmetrically in the horizontal direction about the center position of the micro-lens ML. That is, two avalanche diodes of the present embodiment have two sensitivity regions that are in an optically conjugate relationship to one micro-lens ML. Accordingly, signals obtained from two avalanche diodes may be used as signals for phase difference autofocusing.

Figure 9:
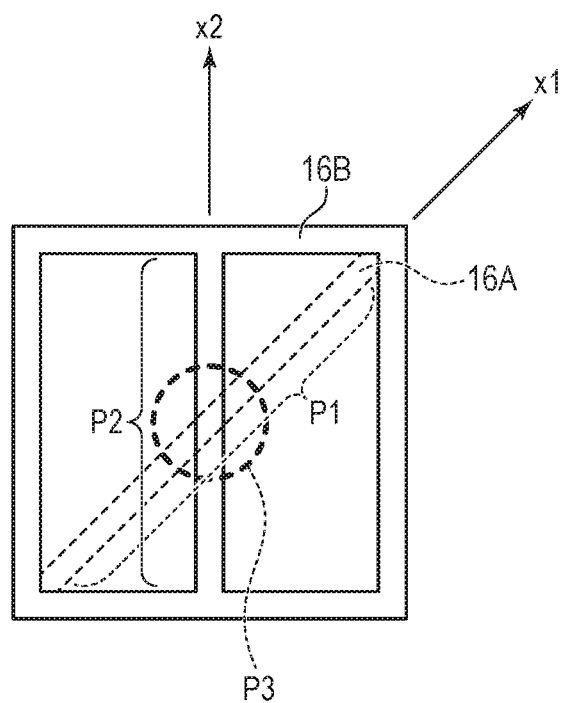
FIG. 9 is a schematic plan view in which isolation portions are overlapped for illustration.

With reference to FIG. 9, the positional relationship between the isolation portion 16A and the isolation portion 16B will be described in more detail. FIG. 9 is a schematic plan view in which the isolation portion 16A of FIG. 8A and the isolation portion 16B of FIG. 8B are overlapped for illustration. As illustrated in FIG. 9, the isolation portion 16A includes the first portion P1 extending in the x1 direction (first direction). Further, the isolation portion 16B includes the second portion P2 extending in the x2 direction (second direction) intersecting the x1 direction in plan view. In this case, a part of the first portion P1 and a part of the second portion P2 are overlapped with each other in an overlapped part P3 in plan view.

As described above, in the present embodiment, a portion of the isolation portion 16A, which isolates the two first semiconductor regions 71 from each other, and a portion of the isolation portion 16B, which isolates the two fifth semiconductor regions 75 from each other, intersect with each other in plan view. That is, the shape of the isolation portion 16A and the shape of the isolation portion 16B are different from each other in plan view. More specifically, a part of the first portion P1 of the isolation portion 16A and a part of the second portion P2 of the isolation portion 16B are overlapped with each other in the overlapped part P3 in plan view. Accordingly, a photoelectric conversion device 10 with improved flexibility of layout is provided, and the shape of an avalanche region and the shape of a sensitivity region can be designed to shapes suitable for respective characteristics.

More specifically, the isolation portion 16A of the present embodiment is arranged extending in the diagonal direction so that the distance R when two avalanche diodes are arranged in a square region is the largest. In contrast, the isolation portion 16B of the present embodiment is arranged extending in the vertical direction because it is necessary to arrange the sensitivity regions symmetrically in the horizontal direction in the drawings taking an acquisition direction of a phase difference used for phase difference autofocusing into consideration. In other words, since required characteristics and design constraints are different for the isolation portion 16A defining an avalanche region and the isolation portion 16B defining a sensitivity region, these regions are designed to have different shapes from each other. In such a way, by making the shape of the isolation portion 16A and the shape of the isolation portion 16B differ from each other, it is possible to achieve both an effect of reducing noise due to a tunnel effect caused by the increased distance R and requirement of acquiring signals used for phase difference autofocusing. Further, since it is possible to increase the distance R by arranging two avalanche diodes diagonally inside a square region, it is possible to reduce the size of the pixel by employing the configuration of the present embodiment when the maximum value of the distance R is constrained. Accordingly, the number of pixels can be increased, and an advantage of improved quality of an obtained image can be obtained.

Note that, although each outer circumference shape of the isolation portions 16A and 16B is a square in the present embodiment, the outer circumference shape is not limited thereto. For example, each outer circumference shape of the isolation portions 16A and 16B may be a rectangle (including a square), and two avalanche diodes may be arranged inside the rectangular region. Also in such a case, the isolation portion 16A is arranged extending in the diagonal line direction so that the distance R in arranging two avalanche diodes is the largest.

Third Embodiment

A photoelectric conversion device according to a third embodiment will be described. In description of the present embodiment, features having the same function as those of the first embodiment or the second embodiment will be labeled with the same references, and detailed description thereof may be omitted or simplified.

Figure 10:
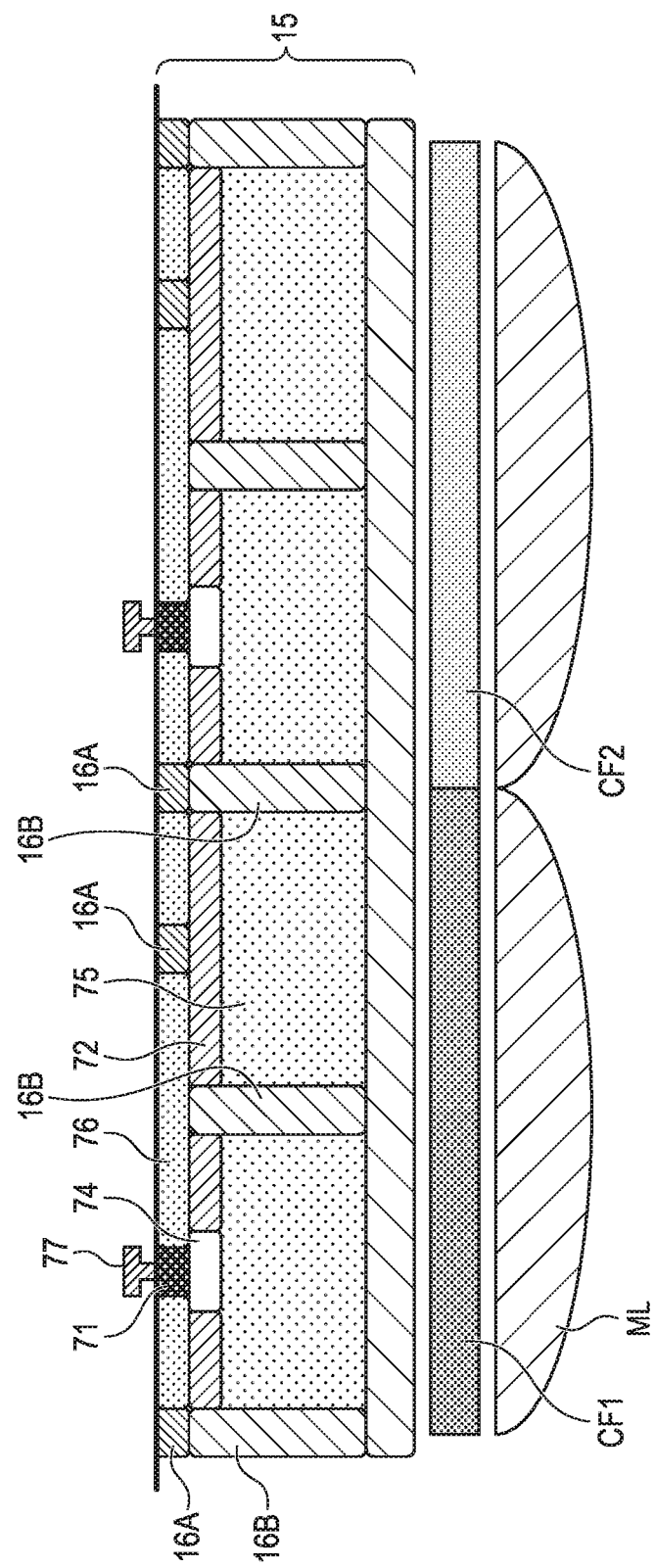
FIG. 10 is a schematic sectional view of a photoelectric conversion device according to a third embodiment.

The photoelectric conversion device of the present embodiment is a device to which the photoelectric conversion device of the second embodiment is applied to a photoelectric conversion device of the backside irradiation type. FIG. 10 is a schematic sectional view of the photoelectric conversion device according to the present embodiment. FIG. 10 is illustration in which color filters CF1 and CF2 and micro-lenses ML are added to the schematic sectional view taken along the line SL1-SL1' of FIG. 8A, FIG. 8B, and FIG. 8C. As illustrated in FIG. 10, the color filters CF1 and CF2 and the micro-lenses ML are arranged on the second face side of the semiconductor substrate 15.

An incident light passes through the micro-lens ML and the color filter CF1 or CF2 in this order and is received from the second face side of the semiconductor substrate 15. The color filters CF1 and CF2 transmit lights of colors different from each other. The micro-lens ML is shared by two avalanche diodes, and the light that has passed through the micro-lens ML is guided to either one of the two avalanche diodes. Note that, although one micro-lens ML is arranged in association with two avalanche diodes in FIG. 10, the arrangement is not limited thereto. That is, one micro-lens ML may be arranged to correspond to two or more avalanche diodes.

As described above, the photoelectric conversion device of the present embodiment is of the backside irradiation type in which the second face, which is opposite to the first face where a wiring layer is provided, is a light receiving face. Accordingly, in the photoelectric conversion device of the present embodiment, sensitivity is further improved compared to the case of the front side irradiation type.

Fourth Embodiment

A photoelectric conversion device according to a fourth embodiment will be described. In description of the present embodiment, features having the same function as those of the first embodiment to the third embodiment will be labeled with the same references, and detailed description thereof may be omitted or simplified.

Figure 11:
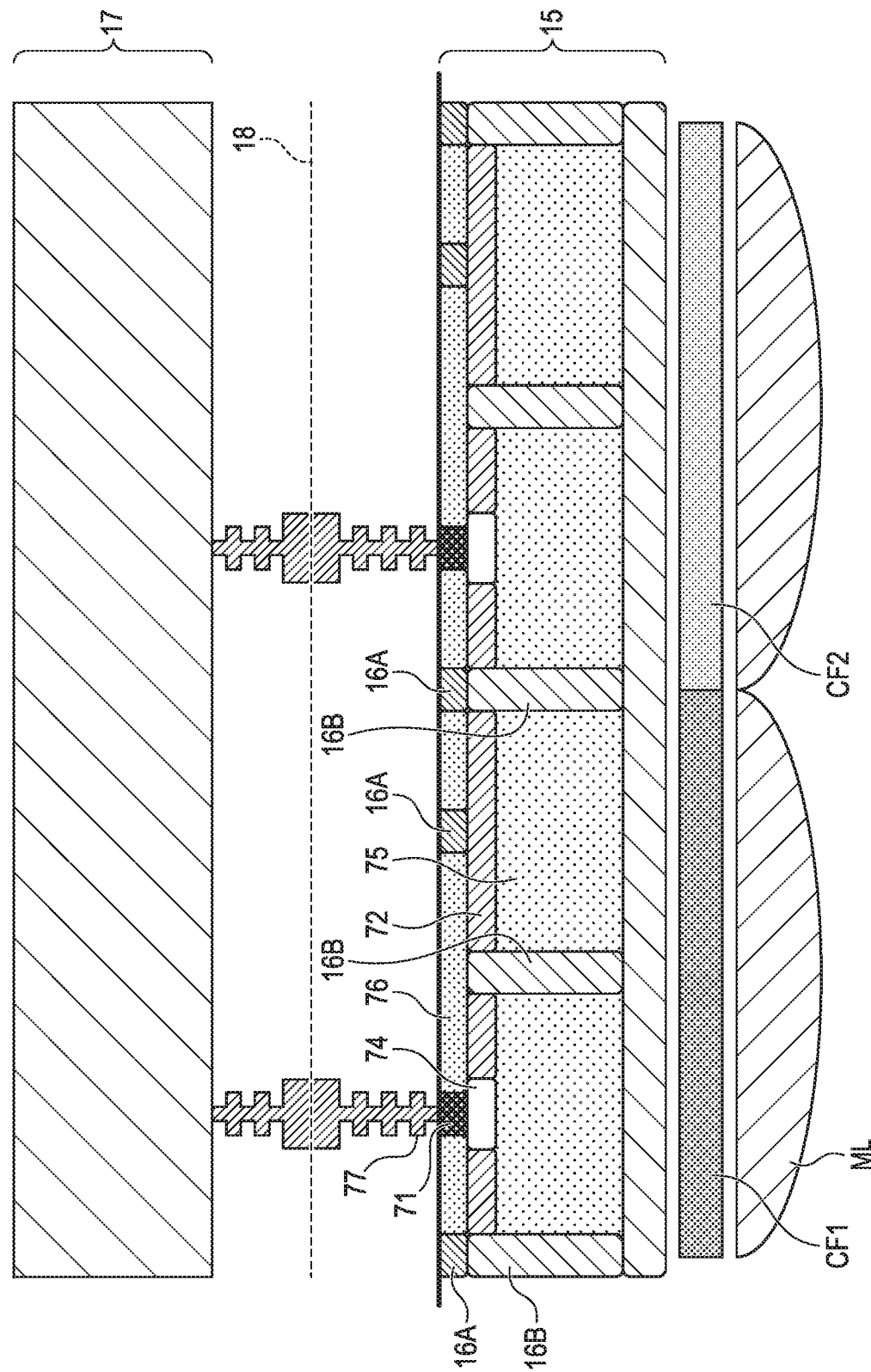
FIG. 11 is a schematic sectional view of a photoelectric conversion device according to a fourth embodiment.

The photoelectric conversion device of the present embodiment is a device to which the photoelectric conversion device of the third embodiment is applied to a photoelectric conversion device of the stack type. FIG. 11 is a schematic sectional view of the photoelectric conversion device according to the present embodiment. FIG. 11 is illustration in which color filters CF1 and CF2, micro-lenses ML, and a semiconductor substrate 17 are added to the schematic sectional view taken along the line SL1-SL1' of FIG. 8A, FIG. 8B, and FIG. 8C. In the same manner as in the third embodiment, the color filters CF1 and CF2 and the micro-lenses ML are arranged on the second face side of the semiconductor substrate 15. Further, the semiconductor substrate 17 is joined on the first face side of the semiconductor substrate 15 via a junction interface 18 and mechanically and electrically connected to the semiconductor substrate 15. A signal processing circuit that processes a signal output from an avalanche diode, such as the pixel signal processing unit 102, is included in the semiconductor substrate 17.

As described above, the photoelectric conversion device of the present embodiment is of the stacked type in which the semiconductor substrate 15 (first substrate) and the semiconductor substrate 17 (second substrate) are stacked in addition to being the backside irradiation type as with the third embodiment. Avalanche diodes are arranged in the semiconductor substrate 15, and signal processing circuits are arranged in the semiconductor substrate 17. Accordingly, sensitivity regions of avalanche diodes can be wider than the case where avalanche diodes and signal processing circuits are arranged in a single substrate, and the sensitivity is further improved.

Fifth Embodiment

A photoelectric conversion device according to a fifth embodiment will be described. In description of the present embodiment, features having the same function as those of the first embodiment to the fourth embodiment will be labeled with the same references, and detailed description thereof may be omitted or simplified. Unlike the first embodiment to the fourth embodiment, the photoelectric conversion device of the present embodiment is an image sensor with a photodiode using no avalanche multiplication. The photoelectric conversion device of the present embodiment has not only a function of outputting a signal used for capturing but also a function of outputting a signal used for image plane phase difference autofocusing.

Figure 12:
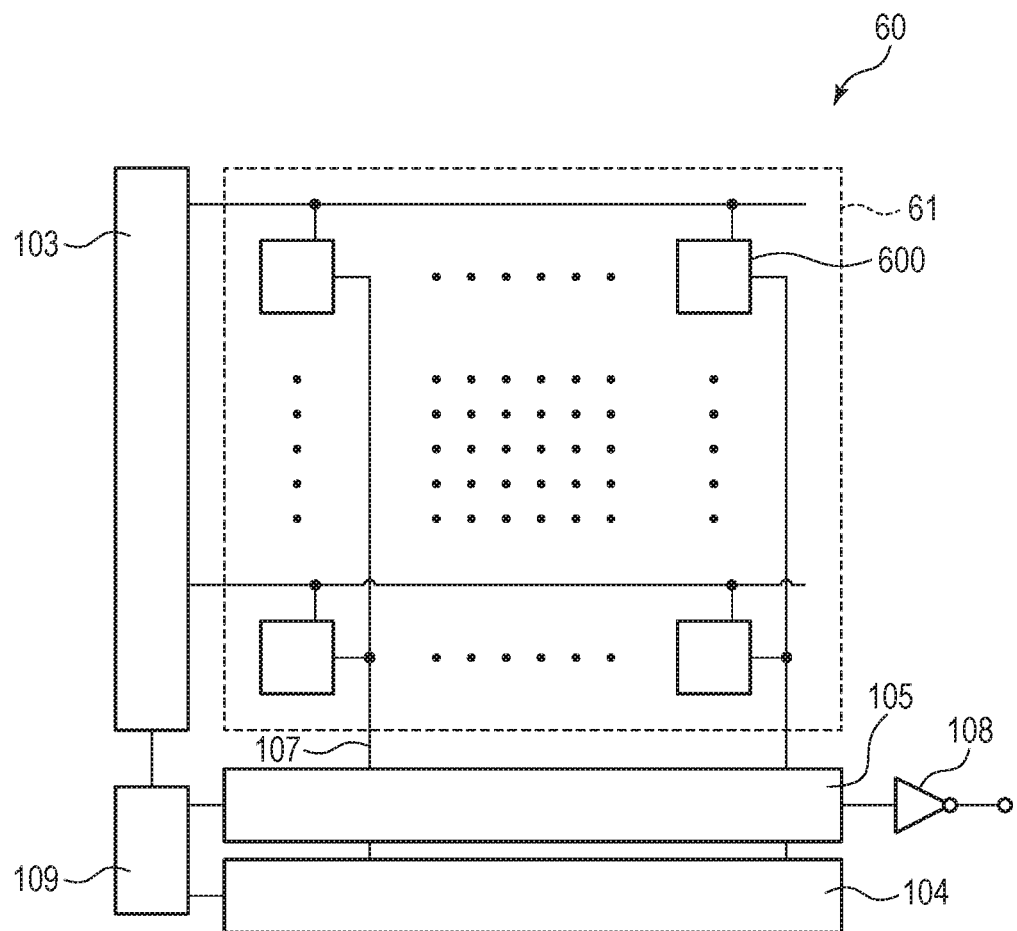
FIG. 12 is a block diagram of a photoelectric conversion device according to a fifth embodiment.

FIG. 12 is a block diagram of a photoelectric conversion device 60 according to the present embodiment. The photoelectric conversion device 60 has a pixel unit 61, the control pulse generation unit 109, the horizontal scanning circuit 104, the column circuit 105, the signal lines 107, the output circuit 108, and the vertical scanning circuit 103. Since the configuration of the control pulse generation unit 109, the horizontal scanning circuit 104, the column circuit 105, the signal lines 107, the output circuit 108, and the vertical scanning circuit 103 is substantially the same as the second embodiment, the description thereof will be omitted.

The pixel unit 61 has a plurality of pixels 600 arranged to form a plurality of rows and a plurality of columns. Each of the pixels 600 has a photodiode that converts an incident light into an electrical signal.

Figure 13:
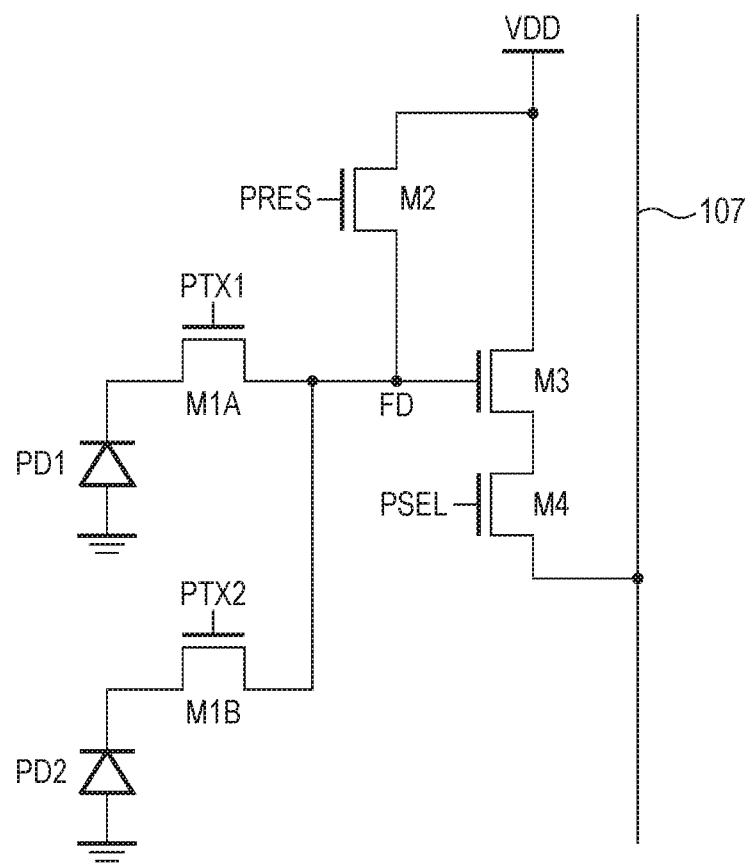
FIG. 13 is an equivalent circuit diagram of a pixel according to the fifth embodiment.

FIG. 13 is one example of an equivalent circuit diagram of the pixel 600 according to the present embodiment. The pixel 600 has photoelectric conversion units PD1 and PD2, transfer transistors M1A and M1B, a reset transistor M2, an amplification transistor M3, and a select transistor M4. Each of these transistors may be an N-channel MOS transistor. A control signal PTX1 is input from the vertical scanning circuit 103 to the gate of the transfer transistor M1A. A control signal PTX2 is input from the vertical scanning circuit 103 to the gate of the transfer transistor M1B. A control signal PRES is input from the vertical scanning circuit 103 to the gate of the reset transistor M2. A control signal PSEL is input from the vertical scanning circuit 103 to the gate of the select transistor M4.

Each of the photoelectric conversion units PD1 and PD2 generates charges by photoelectric conversion in accordance with an incident light and accumulates the charges. Each of the photoelectric conversion units PD1 and PD2 is not an avalanche diode as described in the first to fourth embodiments but a typical photodiode using no avalanche amplification. Each anode of the photoelectric conversion units PD1 and PD2 is connected to a ground electric potential line. The cathode of the photoelectric conversion unit PD1 is connected to the source of the transfer transistor M1A. The cathode of the photoelectric conversion unit PD2 is connected to the source of the transfer transistor M1B.

The connection node of the drains of the transfer transistors M1A and M1B, the source of the reset transistor M2, and the gate of the amplification transistor M3 forms a floating diffusion FD. The drain of the reset transistor M2 and the drain of the amplification transistor M3 are connected to a power source electric potential line having an electric potential VDD. The source of the amplification transistor M3 is connected to the drain of the select transistor M4. The source of the select transistor M4 is connected to the signal line 107. The signal line 107 is connected to a current source (not illustrated).

When the control signal PRES is controlled to a high level and the reset transistor M2 is turned on, the electric potential of the floating diffusion FD is reset. When the control signal PTX1 is controlled to the high level and the transfer transistor M1A is turned on, charges accumulated in the photoelectric conversion unit PD1 are transferred to the floating diffusion FD. When the control signal PTX2 is controlled to the high level and the transfer transistor M1B is turned on, charges accumulated in the photoelectric conversion unit PD2 are transferred to the floating diffusion FD. When the control signal PSEL is controlled to the high level and the select transistor M4 is turned on, the amplification transistor M3 and the current source connected to the signal line 107 form a source follower circuit. At this time, a voltage in accordance with the electric potential of the floating diffusion FD is output to the signal line 107.

With such a configuration, the photoelectric conversion device of the present embodiment can output signals based on charges accumulated in the two photoelectric conversion units PD1 and PD2, independently. Further, the photoelectric conversion device of the present embodiment can sum charges accumulated in the two photoelectric conversion units PD1 and PD2 and output a signal based on the sum.

Figure 14:
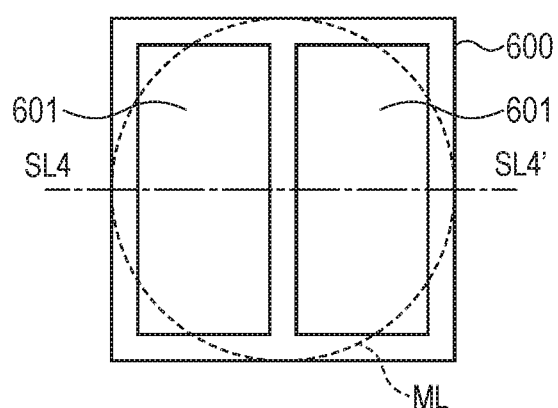
FIG. 14 is a schematic plan view of photodiodes according to the fifth embodiment.

FIG. 14 is a schematic plan view of the photodiode according to the present embodiment. FIG. 14 illustrates the positional relationship between two N-type semiconductor regions 601 and the micro-lens ML forming a part of the photodiode. In FIG. 14, the position of the micro-lens ML that guides an incident light to the two N-type semiconductor regions 601 is depicted by a dashed line. The two N-type semiconductor regions 601 of FIG. 14 correspond to the sensitivity regions of the photoelectric conversion units PD1 and PD2 of FIG. 13, respectively. The positions of the two N-type semiconductor regions 601 are arranged symmetrically in the horizontal direction about the center position of the micro-lens ML. That is, two photodiodes of the present embodiment have two sensitivity regions that are in an optically conjugate relationship to one micro-lens ML. Accordingly, signals obtained from two photodiodes may be used as signals used for image plane phase difference autofocusing.

Figure 15:
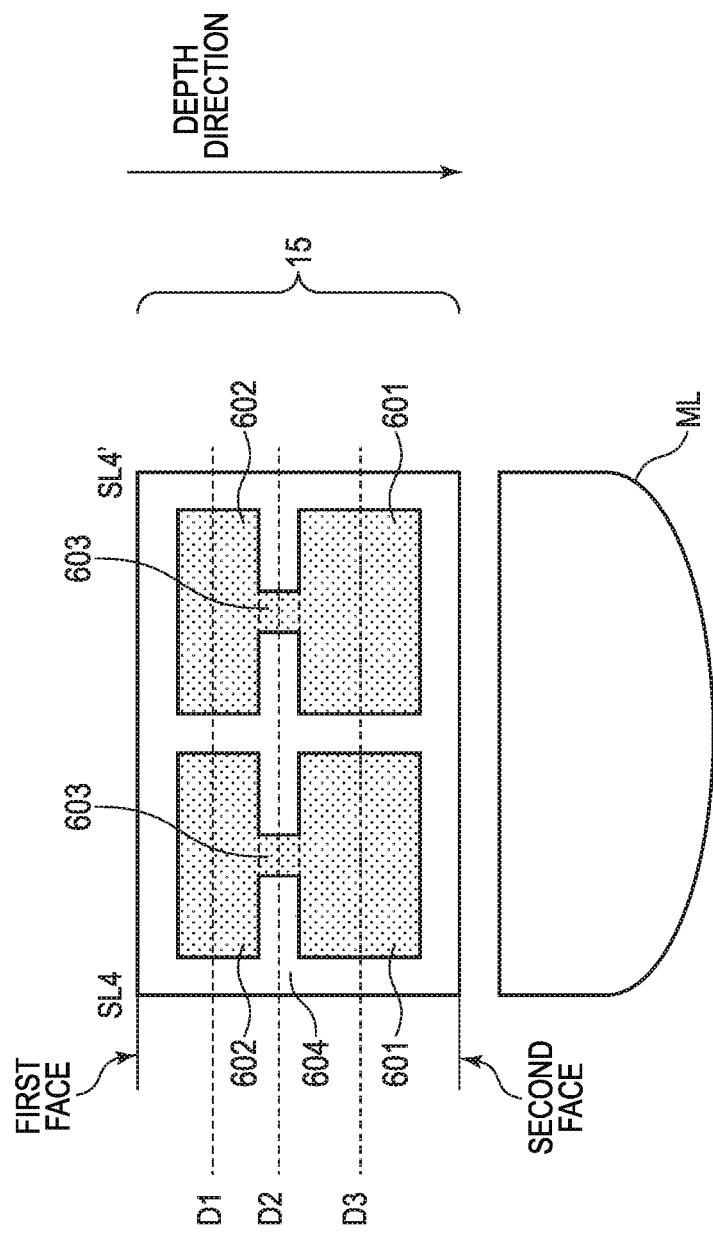
FIG. 15 is a schematic sectional view of the photodiodes according to the fifth embodiment.

FIG. 15 is a schematic sectional view of the photodiode according to the present embodiment. FIG. 15 schematically illustrates a cross section taken along a line SL4-SL4' of FIG. 14. The photodiode of the present embodiment is arranged in the semiconductor substrate 15 (first substrate). The semiconductor substrate 15 has a first face and a second face opposed to the first face. For example, the first face is a front face of the semiconductor substrate 15, and the second face is a back face of the semiconductor substrate 15. In the present embodiment, a direction from the first face to the second face is referred to as a depth direction. On the front face side of the semiconductor substrate 15, gate electrodes of transistors, a multilayer wiring structure, and the like are arranged. On the back face of the semiconductor substrate 15, the micro-lenses ML corresponding to two photodiodes are arranged.

As illustrated in FIG. 15, a P-type semiconductor region 604 and a region surrounded by the P-type semiconductor region 604 are formed in the semiconductor substrate. N-type semiconductor regions 601, 602, and 603 are arranged in the region surrounded by the P-type semiconductor region 604.

The N-type semiconductor region 602 is arranged at a depth D1 (first depth). The N-type semiconductor region 603 is arranged at a depth D2 that is deeper than the depth D1 with respect to the first face. The N-type semiconductor region 601 is arranged at a depth D3 (second depth) that is deeper than the depth D2 with respect to the first face. The N-type semiconductor region 602 and the N-type semiconductor region 603 are in contact in the depth direction, and the N-type semiconductor region 603 and the N-type semiconductor region 601 are in contact in the depth direction.

Figure 16:
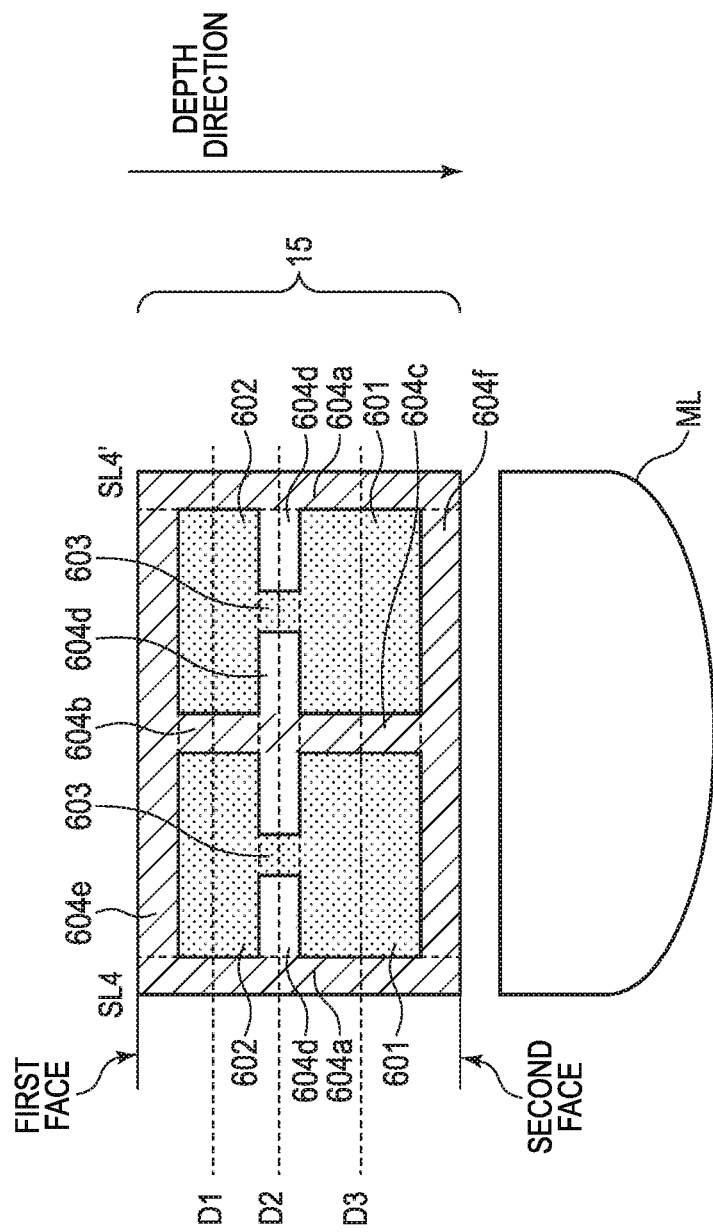
FIG. 16 is a schematic sectional view of the photodiodes according to the fifth embodiment.

FIG. 16 is a schematic sectional view of the photodiode according to the present embodiment. FIG. 16 is a diagram for illustrating the structure of the P-type semiconductor region 604 in more detail for the same cross section as FIG. 15. The P-type semiconductor region 604 includes regions 604a, 604b, 604c, 604d, 604e, and 604f.

The region 604a is arranged to surround the N-type semiconductor regions 601, 602, and 603 from the depth D1 to the depth D3. The region 604a functions as an isolation region between adjacent pixels.

The region 604b (first isolation region) is arranged between two N-type semiconductor regions 602 at the depth D1. The region 604b functions as an isolation region between the two N-type semiconductor regions 602.

The region 604c (second isolation region) is arranged between two N-type semiconductor regions 601 at the depth D3. The region 604c functions as an isolation region between the two N-type semiconductor regions 601.

The region 604d (third isolation region) is arranged in contact with the N-type semiconductor region 601 and the N-type semiconductor region 602 in the depth direction. The region 604d isolates the N-type semiconductor region 601 and the N-type semiconductor region 602 from each other except for a part of a region therebetween (a portion in which the N-type semiconductor region 603 is arranged). In other words, the N-type semiconductor region 601 and the N-type semiconductor region 602 are connected via the N-type semiconductor region 603.

The region 604e is arranged in the first face side of the two N-type semiconductor regions 602 and the region 604b. The region 604f is arranged in the second face side of the two N-type semiconductor regions 601 and the region 604c.

Once a light enters the back face of the semiconductor substrate 15 via the micro-lens ML, electrons occur in the N-type semiconductor region 601 by photoelectric conversion. That is, the N-type semiconductor region 601 functions as a sensitivity region (first region) of the photoelectric conversion device. These electrons (signal charges) move to the N-type semiconductor region 602 via the N-type semiconductor region 603. That is, the N-type semiconductor region 602 functions as an accumulation region (second region) that accumulates charges of the photoelectric conversion device therein. The N-type semiconductor region 603 (third region) corresponds to a transfer path of electrons from the N-type semiconductor region 602 to the N-type semiconductor region 601. To realize this, it is desirable that the potential to an electron increase monotonically on a transfer path of electrons from the N-type semiconductor region 602 to the N-type semiconductor region 601.

Figure 17:
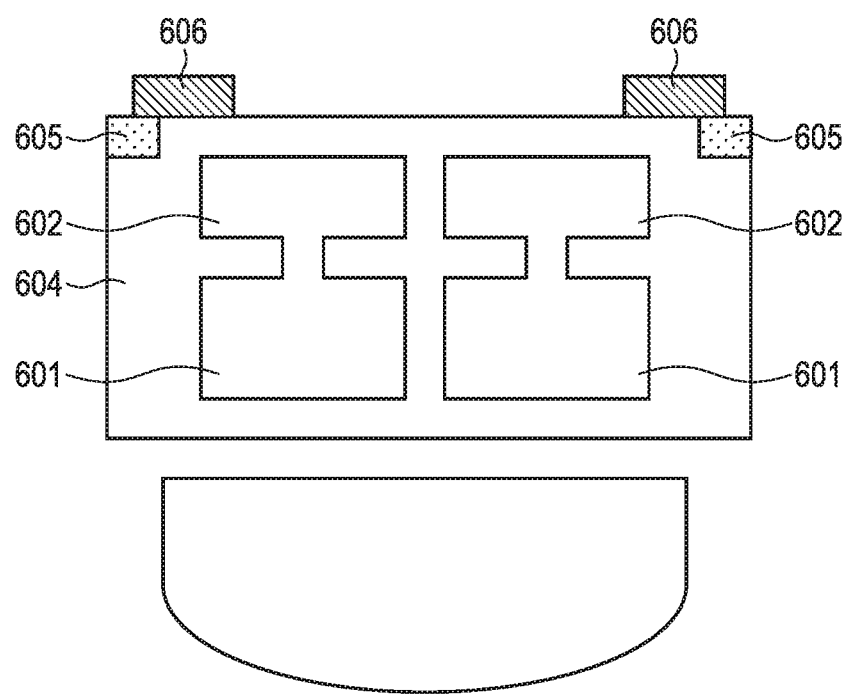
FIG. 17 is a schematic sectional view of the photodiodes according to the fifth embodiment.

FIG. 17 is a schematic sectional view of the photodiode according to the present embodiment. FIG. 17 is a diagram illustrating the structure for transferring charges in more detail for the same cross section as FIG. 15 and FIG. 16. The semiconductor substrate 15 includes semiconductor regions 605 forming the floating diffusion FD. Further, each gate electrode 606 of the transfer transistors M1A and M1B is arranged on the first face at a position corresponding to the P-type semiconductor region 604 between the N-type semiconductor region 602 and the semiconductor region 605. By controlling the voltage of the gate electrode 606, it is possible to transfer charges accumulated in the semiconductor region 602 to the semiconductor region 605. Note that, although the two semiconductor regions 605 are depicted as separate regions in FIG. 17, the two semiconductor regions 605 in FIG. 17 may be nodes electrically connected to each other and having the same electric potential, as illustrated in FIG. 13.

Figure 18:
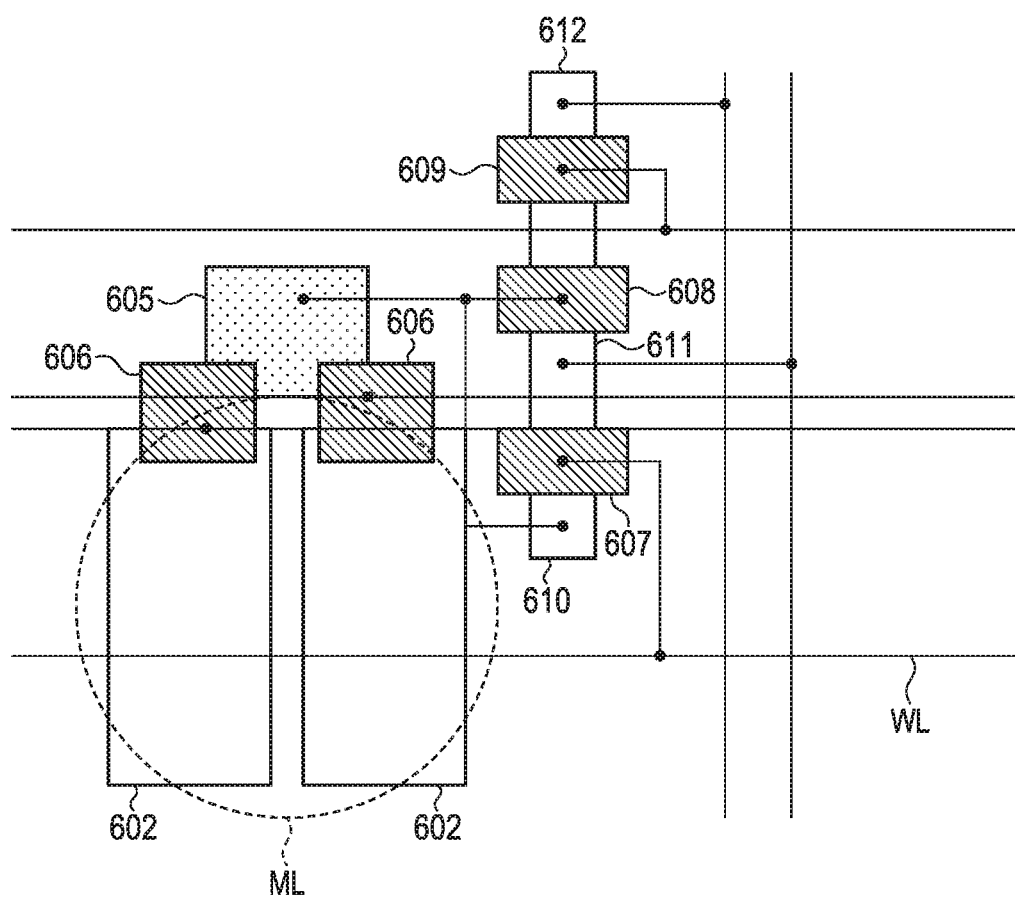
FIG. 18 is a schematic plan view of the pixel according to the fifth embodiment.

FIG. 18 is a schematic plan view of the pixel 600 according to the present embodiment. FIG. 18 illustrates one example of the specific layout of a circuit of the pixel 600 illustrated in FIG. 13. FIG. 18 depicts the positions of semiconductor regions forming a photodiode, a transistor, and the like and the micro-lens ML. Further, FIG. 18 depicts the gate electrodes 606 of the transfer transistors M1A and M1B, a gate electrode 607 of the reset transistor M2, a gate electrode 608 of the amplification transistor M3, and a gate electrode 609 of the select transistor M4. Further, FIG. 18 also depicts wirings WL connecting these components to each other.

The gate electrodes 606 of the transfer transistors M1A and M1B are arranged between the N-type semiconductor region 602 and the semiconductor region 605 in plan view. The semiconductor region 605 is connected to a semiconductor region 610 forming a primary electrode of the reset transistor M2 and the gate electrode 608 of the amplification transistor M3 via the wiring WL. The wirings WL are connected to the gate electrodes 606, 607, and 609, and control signals are input thereto from the vertical scanning circuit 103 via the wirings WL.

The wiring WL that functions as a power source electric potential line having the electric potential VDD is connected to a semiconductor region 611 forming the primary electrodes of the reset transistor M2 and the amplification transistor M3. The wiring WL that functions as the signal line 107 used for externally outputting a signal voltage is connected to a semiconductor region 612 forming the primary electrode of the select transistor M4.

In the present embodiment, the N-type semiconductor region 601 and the N-type semiconductor region 602 are connected via the N-type semiconductor region 603. Accordingly, the N-type semiconductor region 601 and the N-type semiconductor region 602 can have different shapes from each other in plan view. Further, since the N-type semiconductor region 601 and the N-type semiconductor region 602 can be designed independently of each other for the positional relationship thereof, there may be various specific forms of the positional relationship between the N-type semiconductor region 601 and the N-type semiconductor region 602. Two types of arrangement examples of the N-type semiconductor region 601 and the N-type semiconductor region 602 will be described.

Figure 19A:
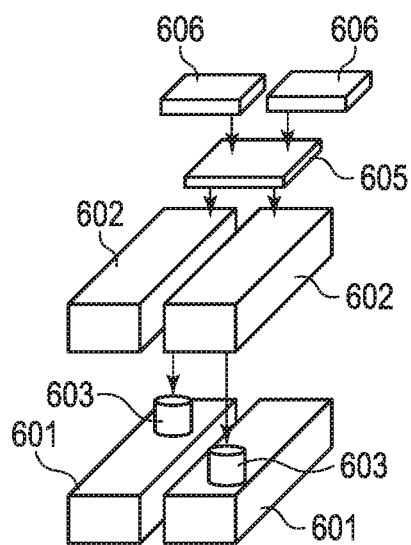
FIG. 19A, FIG. 19B, and FIG. 19C are schematic diagrams illustrating a first example of the arrangement of semiconductor regions according to the fifth embodiment.
Figure 19B:
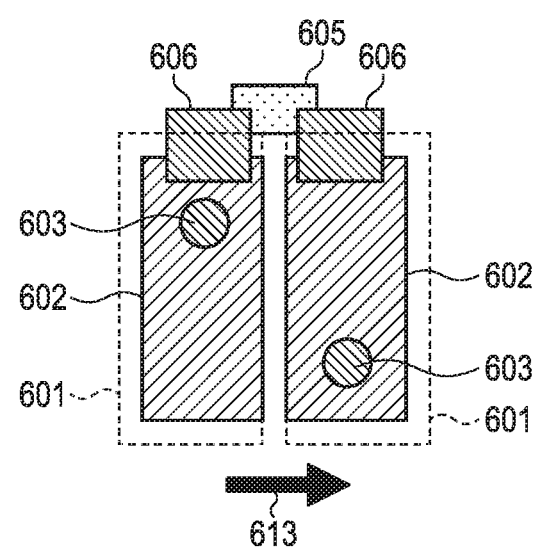
Figure 19C:
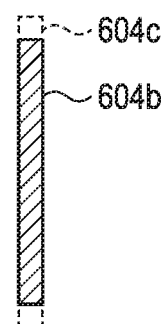

FIG. 19A, FIG. 19B, and FIG. 19C are schematic diagrams illustrating a first example of the arrangement of semiconductor regions according to the present embodiment. FIG. 19A is a schematic perspective view illustrating the arrangement of N-type semiconductor regions 601, 602, and 603, the semiconductor region 605, and the gate electrode 606. As illustrated in FIG. 19A, each of the N-type semiconductor regions 601 and the N-type semiconductor regions 602 has a rectangular parallelepiped shape extending in the depth direction of the drawing sheet. That is, the N-type semiconductor regions 601 and the N-type semiconductor regions 602 extend in the same direction.

FIG. 19B is a schematic plan view illustrating the arrangement of N-type semiconductor regions 601, 602, and 603, the semiconductor region 605, and the gate electrode 606. As illustrated in FIG. 19B, all the N-type semiconductor regions 601 and the N-type semiconductor regions 602 extend in the vertical direction of the drawing sheet. In other words, the two N-type semiconductor regions 601 are arranged next to each other in the horizontal direction of the drawing sheet, and the two N-type semiconductor regions 602 are also arranged next to each other in the horizontal direction of the drawing sheet. In such a configuration, since the N-type semiconductor regions 601 from which charges are generated by photoelectric conversion are arranged at positions spaced apart in the horizontal direction, it is possible to acquire signals used for image plane phase difference autofocusing by which a parallax in the horizontal direction may be mainly detected. In FIG. 19B, the direction of phase difference detection is represented by an arrow 613.

FIG. 19C is a schematic plan view illustrating the positional relationship in plan view between the region 604b that functions as an isolation region between the N-type semiconductor regions 602 and the region 604c that functions as an isolation region between the N-type semiconductor regions 601. As illustrated in FIG. 19C, both the region 604b and the region 604c extend in the vertical direction of the drawing sheet.

Figure 20A:
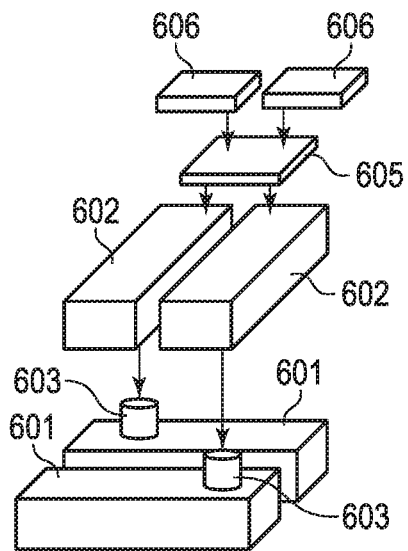
FIG. 20A, FIG. 20B, and FIG. 20C are schematic diagrams illustrating a second example of the arrangement of semiconductor regions according to the fifth embodiment.
Figure 20B:
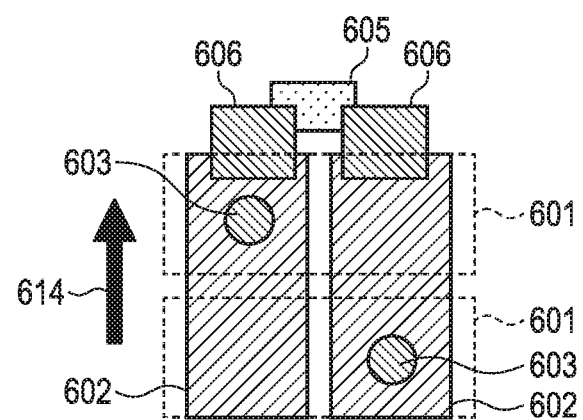
Figure 20C:
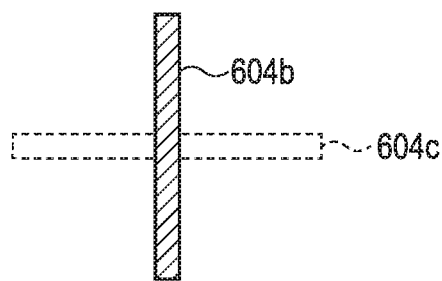

FIG. 20A, FIG. 20B, and FIG. 20C are schematic diagrams illustrating a second example of the arrangement of semiconductor regions according to the present embodiment. A primary difference from FIG. 19A, FIG. 19B, and FIG. 19C is in the arrangement of the semiconductor regions 601.

As illustrated in FIG. 20A, each of the N-type semiconductor regions 602 has a rectangular parallelepiped shape extending in the depth direction of the drawing sheet, and each of the N-type semiconductor regions 601 has a rectangular parallelepiped shape extending in the horizontal direction of the drawing sheet. That is, the N-type semiconductor region 601 and the N-type semiconductor region 602 extend in directions orthogonal to each other, namely, in different directions in plan view.

As illustrated in FIG. 20B, each of the N-type semiconductor regions 602 extends in the vertical direction of the drawing sheet, and each of the N-type semiconductor regions 601 extends in the horizontal direction of the drawing sheet. In other words, the two N-type semiconductor regions 601 are arranged next to each other in the vertical direction of the drawing sheet, and the two N-type semiconductor regions 602 are arranged next to each other in the horizontal direction of the drawing sheet. In such a configuration, since the N-type semiconductor regions 601 from which charges are generated by photoelectric conversion are arranged at positions spaced apart in the vertical direction, it is possible to acquire signals used for image plane phase difference autofocusing by which a parallax in the vertical direction may be mainly detected. In FIG. 20B, the direction of phase difference detection is represented by an arrow 614.

FIG. 20C is a schematic plan view illustrating the positional relationship in plan view between the region 604b that functions as an isolation region between the N-type semiconductor regions 602 and the region 604c that functions as an isolation region between the N-type semiconductor regions 601. As illustrated in FIG. 20C, the region 604b extends in the vertical direction of the drawing sheet, and the region 604c extends in the horizontal direction of the drawing sheet. That is, the region 604b and the region 604c extend in directions orthogonal to each other, namely, in different directions in plan view.

Figure 21A:
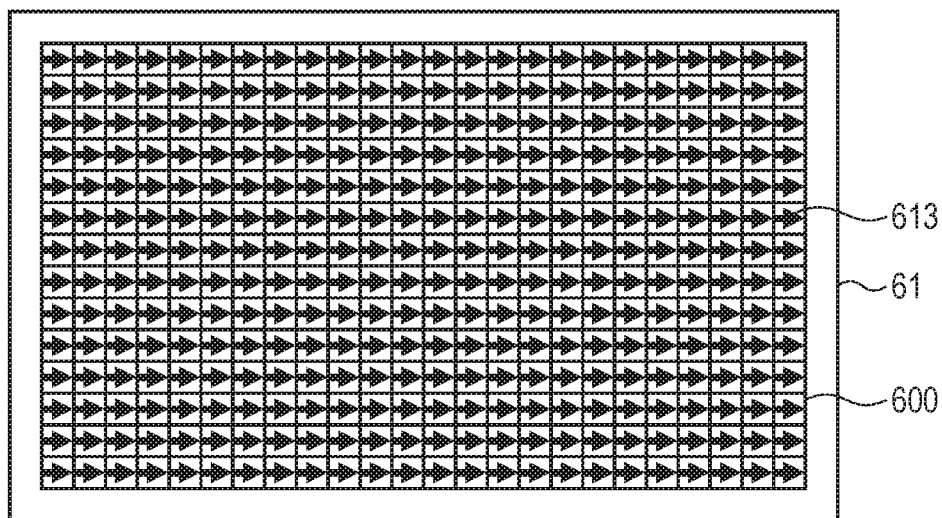
FIG. 21A and FIG. 21B are schematic plan views illustrating an arrangement example of pixels according to the fifth embodiment.
Figure 21B:
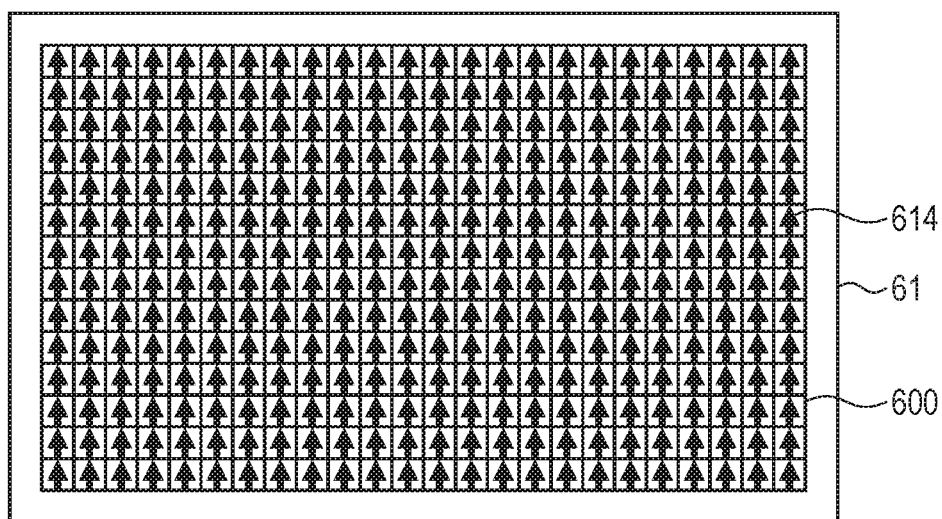

FIG. 21A and FIG. 21B are schematic plan views illustrating an arrangement example of the pixel 600. FIG. 21A illustrates an example in which the pixels 600 of the first example illustrated in FIG. 19A, FIG. 19B, and FIG. 19C are arranged in a matrix. In this example, the arrow 613 indicating the direction of phase difference detection is oriented in the horizontal direction. FIG. 21B illustrates an example in which the pixels 600 of the second example illustrated in FIG. 20A, FIG. 20B, and FIG. 20C are arranged in a matrix. In this example, the arrow 614 indicating the direction of phase difference detection is oriented in the vertical direction.

As described above, each of the pixels 600 of the present embodiment has the N-type semiconductor regions 602 arranged at the depth D1 and the N-type semiconductor regions 601 arranged at the depth D3 that is deeper than the depth D1 with respect to the first face. With a sufficient thickness of the N-type semiconductor region 601, the most part of a light received from the second face side is absorbed by the N-type semiconductor region 601 and does not reach the N-type semiconductor region 602. Accordingly, the N-type semiconductor region 601 functions as a sensitivity region that generates charges from an incident light by photoelectric conversion. Charges generated in the N-type semiconductor region 601 move to the N-type semiconductor region 602 via the N-type semiconductor region 603 and are accumulated therein. That is, the N-type semiconductor region 602 functions as an accumulation region that accumulates charges generated by photoelectric conversion.

In such a way, the N-type semiconductor region 601 and the N-type semiconductor region 602 are located at different positions in the thickness direction of the substrate and thus have different functions from each other. It is therefore possible to design the plan view shapes of the N-type semiconductor region 601 and the N-type semiconductor region 602 to be different in accordance with the purpose. In another point of view, the region 604b that functions as an isolation region between the N-type semiconductor regions 602 and the region 604c that functions as an isolation region between the N-type semiconductor regions 601 can be designed to have different shapes in plan view.

In the first example of FIG. 19B and FIG. 21A, the two N-type semiconductor regions 601 are arranged next to each other in the horizontal direction of the drawing sheet, and it is possible to acquire signals used for image plane phase difference autofocusing by which a parallax in the horizontal direction may be mainly detected. Such design is more useful when a subject has a pattern close to a vertical stripe pattern. In contrast, in the second example of FIG. 20B and FIG. 21B, the two N-type semiconductor regions 601 are arranged next to each other in the vertical direction of the drawing sheet, and it is possible to acquire signals used for image plane phase difference autofocusing by which a parallax in the vertical direction may be mainly detected. Such design is more useful when a subject has a pattern close to a horizontal stripe pattern. In such a way, by changing the shape of the N-type semiconductor regions 601 that functions as sensitivity regions taking an expected subject feature into consideration, it is possible to have different detection directions in image plane phase difference autofocusing. In the above two examples, the N-type semiconductor regions 602 that function as accumulation regions have the same design. Further, the design of the gate electrodes 606, the semiconductor regions 605, the wirings WL, or the like can also be the same between the two examples. That is, since design of portions other than a sensitivity region can be common without depending on the shape of an accumulation region, the design is simplified.

As described above, according to the present embodiment, it is possible to provide a photoelectric conversion device that may optimize the structure of photodiodes that output signals used for image plane phase difference autofocusing taking positions in the thickness direction of a substrate into consideration. Accordingly, a photoelectric conversion device that may output signals in an appropriate parallax detection direction in accordance with the shape of a subject is provided.

Note that, even with a circuit configuration using a typical photodiode as with the present embodiment, the structure in which the first substrate in which photodiodes are arranged and the second substrate in which signal processing circuits are arranged are stacked can be applied in the same manner as the fourth embodiment. In such a case, the area of the sensitivity region of the photodiode can be wider, and the sensitivity is further improved.

Sixth Embodiment

A photoelectric conversion device according to a sixth embodiment will be described. In description of the present embodiment, features having the same function as those of the first embodiment to the fifth embodiment will be labeled with the same references, and detailed description thereof may be omitted or simplified. The photoelectric conversion device of the present embodiment is a modified example for the arrangement of the pixels 600 described in the fifth embodiment.

Figure 22:
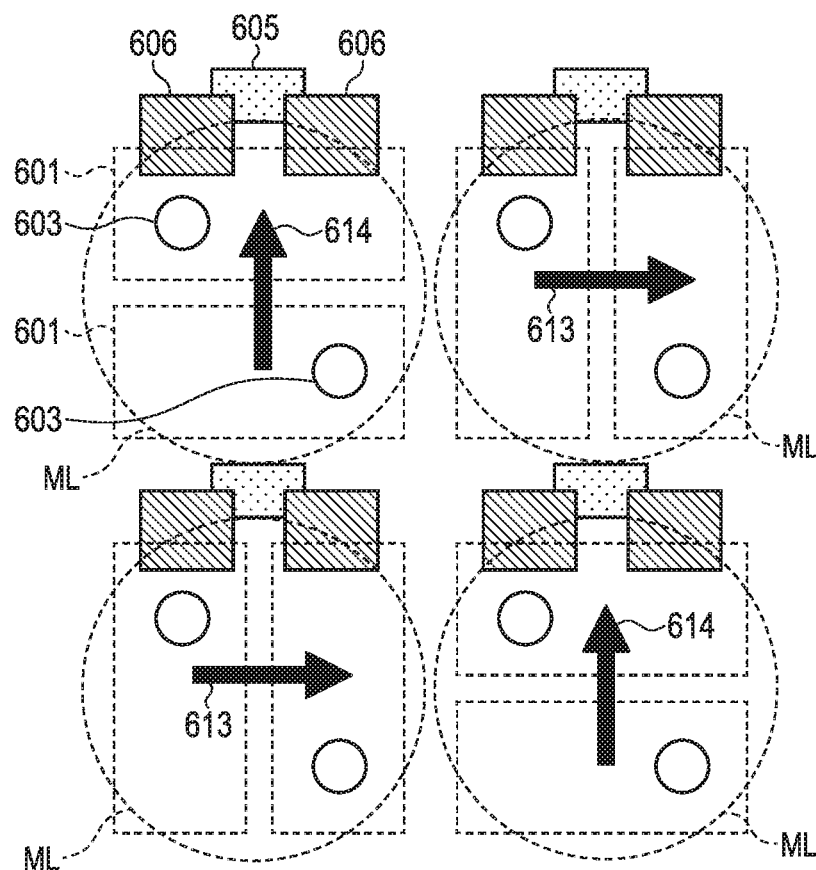
FIG. 22 is a schematic plan view of pixels according to a sixth embodiment.

FIG. 22 is a schematic plan view of pixels according to the present embodiment. FIG. 22 depicts four pixels of two rows by two columns and illustrates the arrangement of the N-type semiconductor regions 601 and 603, the semiconductor regions 605, the gate electrodes 606, and the micro-lenses ML. Since the arrangement of the N-type semiconductor regions 602 is the same as that of FIG. 19B and FIG. 20B, the illustration thereof is omitted in FIG. 22.

In the left upper pixel in FIG. 22, the two N-type semiconductor regions 601 (a first photodiode group corresponding to a first micro-lens ML) are arranged next to each other in the vertical direction of the drawing sheet in the same manner as in FIG. 20B. In pixels adjacent to the left upper pixel (the right upper pixel and the left under pixel) in FIG. 22, the two N-type semiconductor regions 601 (a second photodiode group corresponding to a second micro-lens ML) are arranged next to each other in the horizontal direction of the drawing sheet in the same manner as in FIG. 19B.

Figure 23:
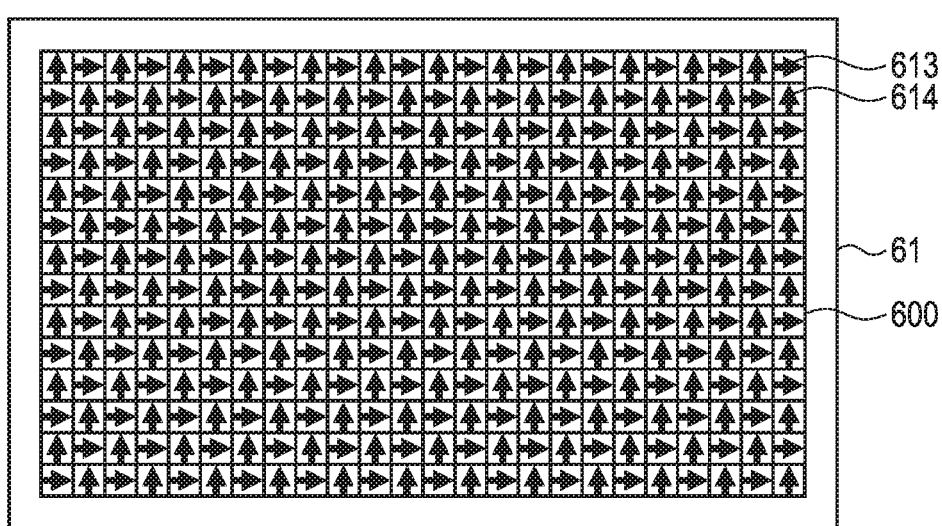
FIG. 23 is a schematic plan view illustrating an arrangement example of pixels according to the sixth embodiment.

FIG. 23 is a schematic plan view illustrating an arrangement example of the pixels 600. FIG. 23 illustrates an example in which four pixels of two rows by two columns illustrated in FIG. 22 defined as one unit are repeatedly arranged. In this example, with respect to the orientations of the arrows 613 and 614 indicating directions of phase difference detection, the horizontal direction and the vertical direction are alternatingly repeated.

In the present embodiment, the pixel unit 61 includes both pixels that may detect mainly a parallax in the horizontal direction illustrated in the first example of FIG. 19B and pixels that may detect mainly a parallax in the vertical direction illustrated in the second example of FIG. 20B. It is therefore possible to obtain multiple pairs of signals used for image plane phase difference autofocusing having different detection directions. This enables accurate focus detection with less dependency on the shape of a subject from the plurality of pixels 600 of the pixel unit 61. For example, when the subject has a stripe pattern, stable focus detection accuracy can be obtained regardless of the direction of stripe. As described above, in the present embodiment, a photoelectric conversion device that may realize focus detection in accordance with various situations is provided.

Figure 24:
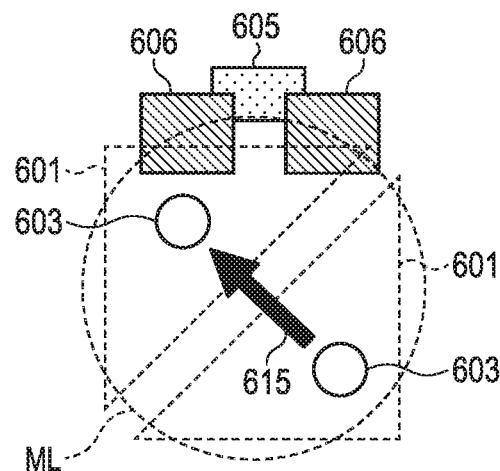
FIG. 24 is a schematic plan view of a pixel according to a modified example of the sixth embodiment.

Note that, although the combination of orientations of the arrows 613 and 614 indicating the directions of phase difference detection is a combination of only two types of directions of the horizontal direction and the vertical direction in the examples described above, a combination of two types of directions other than the above may be employed, or a combination of three or more types of directions may be employed. FIG. 24 is a schematic plan view of a pixel according to a modified example of the present embodiment. As illustrated in FIG. 24, when the shapes of the two N-type semiconductor regions 601 are triangles next to each other in the diagonal direction, the direction of phase difference detection indicated by an arrow 615 can be a diagonal direction. By including the pixels 600 having the configuration of FIG. 24 in the pixel unit 61, it is possible to obtain signals used for image plane phase difference autofocusing in more various detection directions.

Seventh Embodiment

A photoelectric conversion device according to a seventh embodiment will be described. In description of the present embodiment, features having the same function as those of the first embodiment to the sixth embodiment will be labeled with the same references, and detailed description thereof may be omitted or simplified. The photoelectric conversion device of the present embodiment is a modified example for the arrangement of the pixels 600 described in the fifth embodiment and the sixth embodiment.

Figure 25:
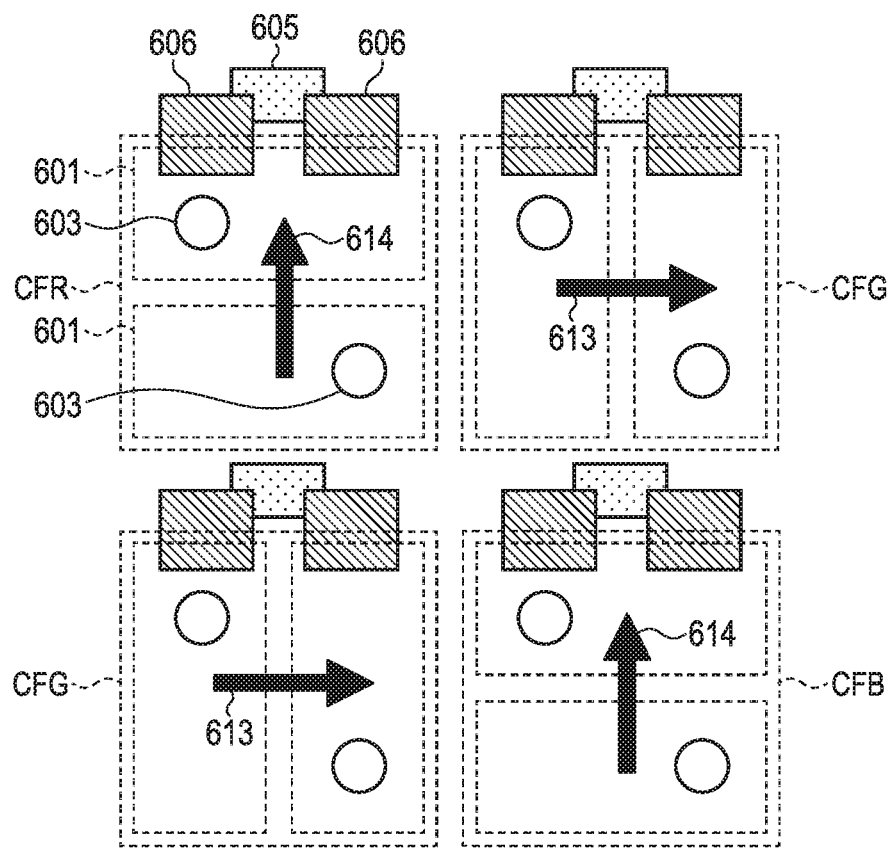
FIG. 25 is a schematic plan view of pixels according to a seventh embodiment.

FIG. 25 is a schematic plan view of pixels according to the present embodiment. FIG. 25 depicts four pixels of two rows by two columns in the same manner as in FIG. 22 and illustrates the arrangement of the N-type semiconductor regions 601 and 603, the semiconductor regions 605, and the gate electrodes 606. Note that depiction of the micro-lenses ML is omitted. Furthermore, FIG. 25 illustrates the arrangement of color filters CFR, CFG, and CFB provided in association with respective pixels. The color filters CFR, CFG, and CFB are provided between the second face of the semiconductor substrate and the micro-lenses ML in the same manner as in FIG. 10.

The color filter CFR is a color filter that transmits red light, and one color filter CFR is provided in the four pixels of two rows by two columns. The color filter CFG is a color filter that transmits green light, and two color filters CFG are provided in the four pixels of two rows by two columns. The color filter CFB is a color filter that transmits blue light, and one color filter CFB is provided in the four pixels of two rows by two columns. The arrangement scheme of the color filters CFR, CFG, and CFB of FIG. 25 is known as the Bayer arrangement, however, this is one example, and another arrangement scheme may be employed. In the following, pixels provided with the color filters CFR, CFG, and CFB may be referred to as a red pixel, a green pixel, and a blue pixel, respectively.

As illustrated in FIG. 25, in the present embodiment, pixels that may detect mainly a parallax in the horizontal direction illustrated in the first example of FIG. 19B are green pixels, and pixels that may detect mainly a parallax in the vertical direction illustrated in the second example of FIG. 20B are red pixels or blue pixels. In such a way, in the present embodiment, pixels used for different detection directions have color filters of different colors.

Since a focus can be detected more accurately when colors are not mixed in a comparison of signals used for image plane phase difference autofocusing, it is desirable that colors be the same in each detection direction. Accordingly, in the present embodiment, the arrangement of color filters is set such that pixels used for different detection directions have color filters of different colors. Thus, according to the present embodiment, accurate focus detection is possible even with a photoelectric conversion device provided for color image capturing.

Note that, in the configuration of FIG. 25, although each of signals output from red pixels, green pixels, and blue pixels can be used for image plane phase difference autofocusing, signals of all these colors may be used, or signals of one or two of these colors may be used. Since an optical absorptance of a silicon substrate is higher for green than for red or blue, green pixels have higher sensitivity than other pixels. Thus, it is desirable that at least signals output from green pixels be used for image plane phase difference autofocusing.

Figure 26:
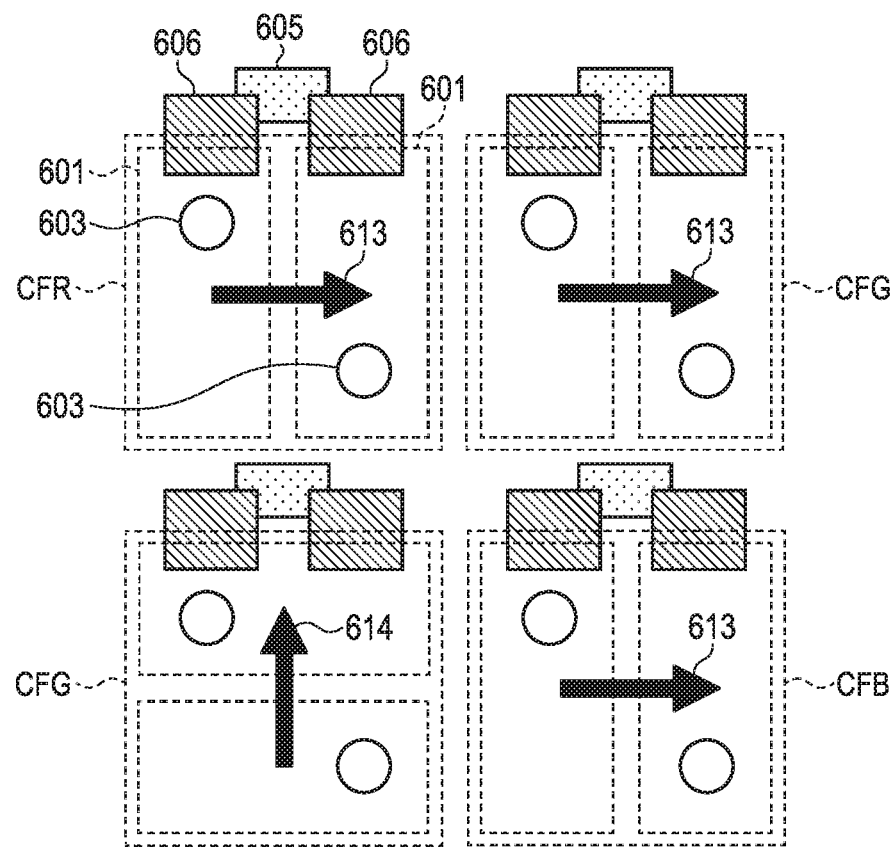
FIG. 26 is a schematic plan view of pixels according to a modified example of the seventh embodiment.

The association relationship of the arrangement of the color filters and the N-type semiconductor regions 601 in FIG. 25 is an example, and another association relationship may be employed. FIG. 26 is a schematic plan view of pixels according to a modified example of the present embodiment. The modified example of FIG. 26 is different from that of FIG. 25 in the arrangement of the N-type semiconductor regions 601. Specifically, one of the two green pixels is a pixel that may detect mainly a parallax in the horizontal direction illustrated in the first example of FIG. 19B, and the other is a pixel that may detect mainly a parallax in the vertical direction illustrated in the second example of FIG. 20B. In such a configuration, signals output from green pixels with high sensitivity can be used for focus detection in two detection directions. Note that signals output from one or both of red pixels and blue pixels may be further used for focus detection.

Eighth Embodiment

A photoelectric conversion device according to an eighth embodiment will be described. In description of the present embodiment, features having the same function as those of the first embodiment to the seventh embodiment will be labeled with the same references, and detailed description thereof may be omitted or simplified. The photoelectric conversion device of the present embodiment is an example in which the photodiode of the pixel 600 described in the fifth embodiment is replaced with an avalanche diode. The detailed structure, the operation of avalanche multiplication, and the like of an avalanche diode are the same as those described in the first embodiment.

FIG. 27 is a schematic sectional view of an avalanche diode according to the present embodiment. The semiconductor substrate 15 of the present embodiment has semiconductor regions 616 that function as regions used for collecting charges from the N-type semiconductor regions 601 and 602 and function as terminals used for acquiring signals. The semiconductor region 616 is a portion corresponding to the first semiconductor region 71 of the first embodiment. Further, neither the gate electrode 606 having the function of charge transfer nor the semiconductor region 605 forming the floating diffusion FD of the fifth embodiment to the seventh embodiment is provided in the sectional structure of the pixel 600 of the present embodiment.

Figure 28A:
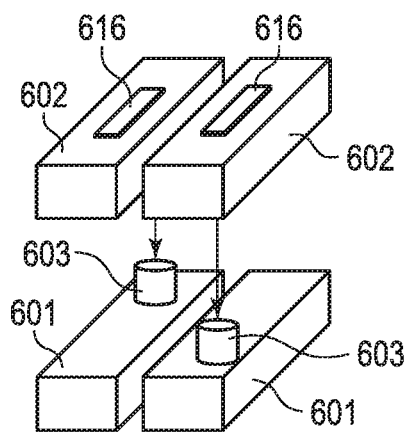
FIG. 28A and FIG. 28B are schematic perspective views of the avalanche diodes according to the eighth embodiment.
Figure 28B:
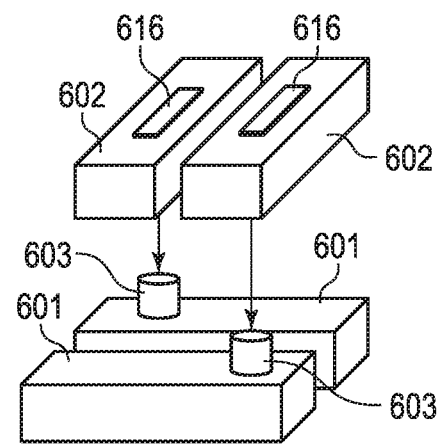

FIG. 28A and FIG. 28B are schematic plan views illustrating the arrangement of the N-type semiconductor regions 601, 602, and 603 and the semiconductor regions 616. FIG. 28A is an arrangement example corresponding to the first example described with reference to FIG. 19A. In the configuration of FIG. 28A, it is possible to acquire signals used for image plane phase difference autofocusing that may detect mainly a parallax in the horizontal direction in the same manner as in the configuration of FIG. 19A. Further, FIG. 28B is an arrangement example corresponding to the second example described with reference to FIG. 20A. In the configuration of FIG. 28B, it is possible to acquire signals used for image plane phase difference autofocusing that may detect mainly a parallax in the depth direction in the same manner as in the configuration of FIG. 20A.

Therefore, also when each photodiode is an avalanche diode that performs an operation of avalanche multiplication as with the present embodiment, the same structure as that in the fifth to seventh embodiment can be realized. That is, a photoelectric conversion device that may optimize the structure of an avalanche diode taking positions in the thickness direction of a substrate into consideration is provided.

Ninth Embodiment

A photoelectric conversion device according to a ninth embodiment will be described. In description of the present embodiment, features having the same function as those of the first embodiment to the eighth embodiment will be labeled with the same references, and detailed description thereof may be omitted or simplified. The photoelectric conversion device of the present embodiment is an example in which a deep trench isolation (DTI) structure is used as an element isolation region between pixels in the pixel 600 described in the fifth embodiment.

Figure 29:
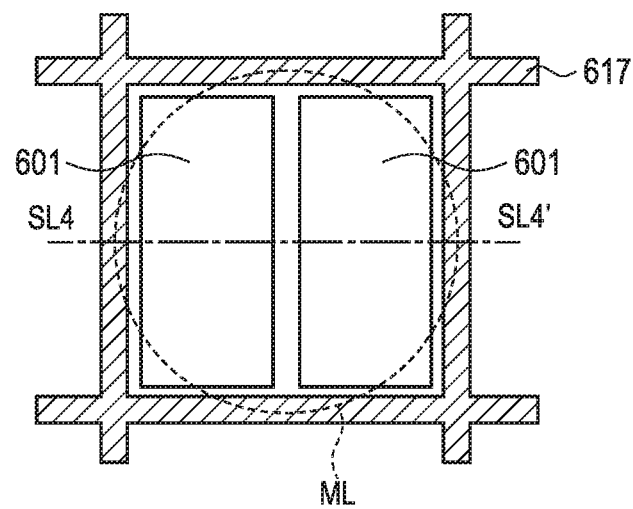
FIG. 29 is a schematic plan view of photodiodes according to a ninth embodiment.
Figure 30:
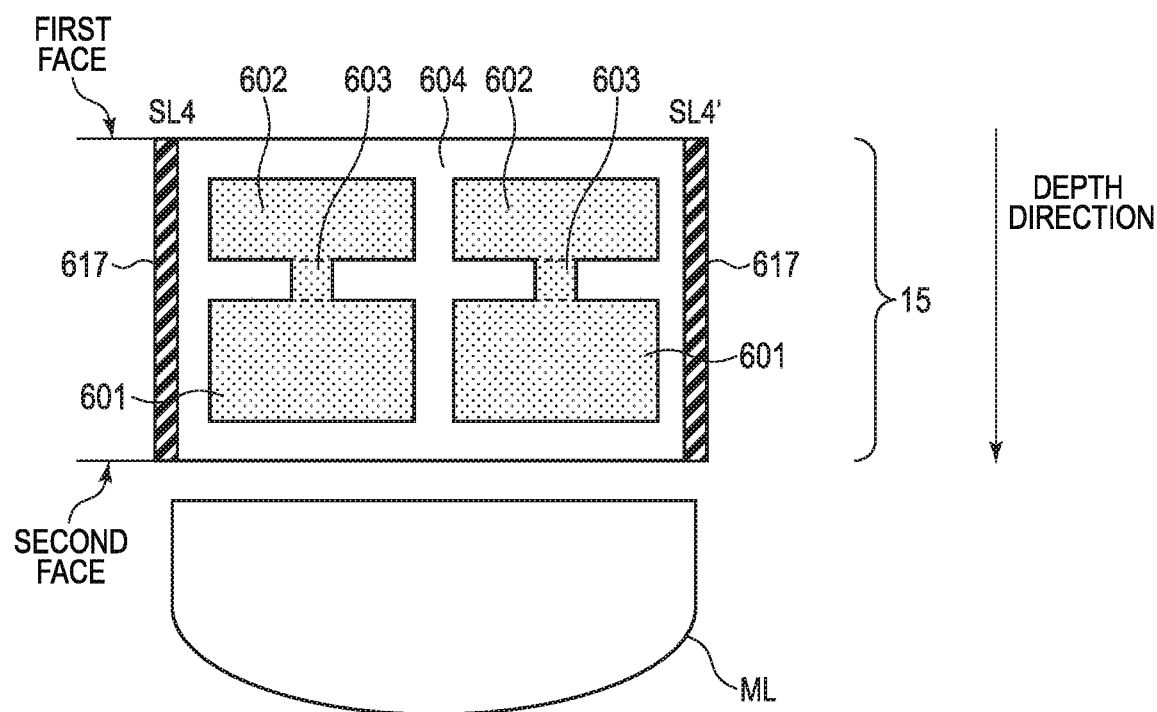
FIG. 30 is a schematic sectional view of the photodiodes according to the ninth embodiment.

FIG. 29 is a schematic plan view of a photodiode according to the present embodiment, and FIG. 30 is a schematic sectional view of the photodiode according to the present embodiment. The photodiode of FIG. 29 and FIG. 30 is different from that of FIG. 14, FIG. 15, or the like of the fifth embodiment in that a DTI structure 617 is added. As illustrated in FIG. 29, the DTI structure 617 is arranged in a grid shape so as to surround two N-type semiconductor regions 601 in plan view. Further, as illustrated in FIG. 30, the DTI structure 617 is arranged in the side part of the N-type semiconductor regions 601 and 602.

Once electrons are generated in the N-type semiconductor region 601 in response to an incident light, crosstalk may occur due to transfer of electrons to an adjacent pixel beyond the potential barrier of the P-type semiconductor region 604. Such crosstalk may cause color mixture in a case of a pixel configuration capable of capturing a color image. Further, when the N-type semiconductor region 601 is so thick that an incident light from the second face is less likely to reach the N-type semiconductor region 602, such crosstalk may be notable. Accordingly, in the present embodiment, the DTI structure 617 having a good insulating property is arranged in the side part of the N-type semiconductor regions 601 and 602 that are transfer paths of electrons to adjacent pixels, and thereby influence of crosstalk is reduced. It is desirable that the DTI structure 617 be formed to reach substantially the same depth as the N-type semiconductor region 601 so as to be arranged at least on the side part of the N-type semiconductor region 601 in which electrons are generated.

Tenth Embodiment

A photoelectric conversion device according to a tenth embodiment will be described. In description of the present embodiment, features having the same function as those of the first embodiment to the ninth embodiment will be labeled with the same references, and detailed description thereof may be omitted or simplified. The photoelectric conversion device of the present embodiment is a photoelectric conversion device in which the number of photodiodes corresponding to one micro-lens ML is reduced to one in the pixel 600 described in the fifth embodiment.

Figure 31:
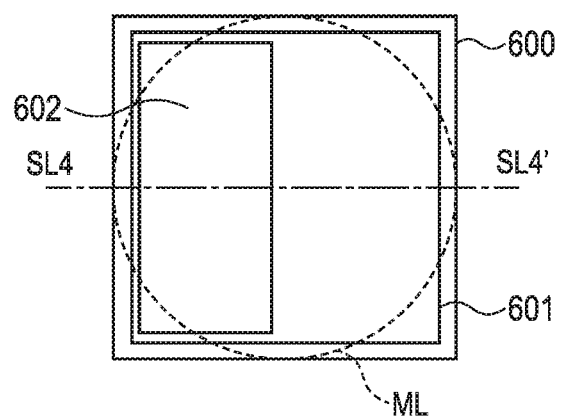
FIG. 31 is a schematic plan view of a photodiode according to a tenth embodiment.
Figure 32:
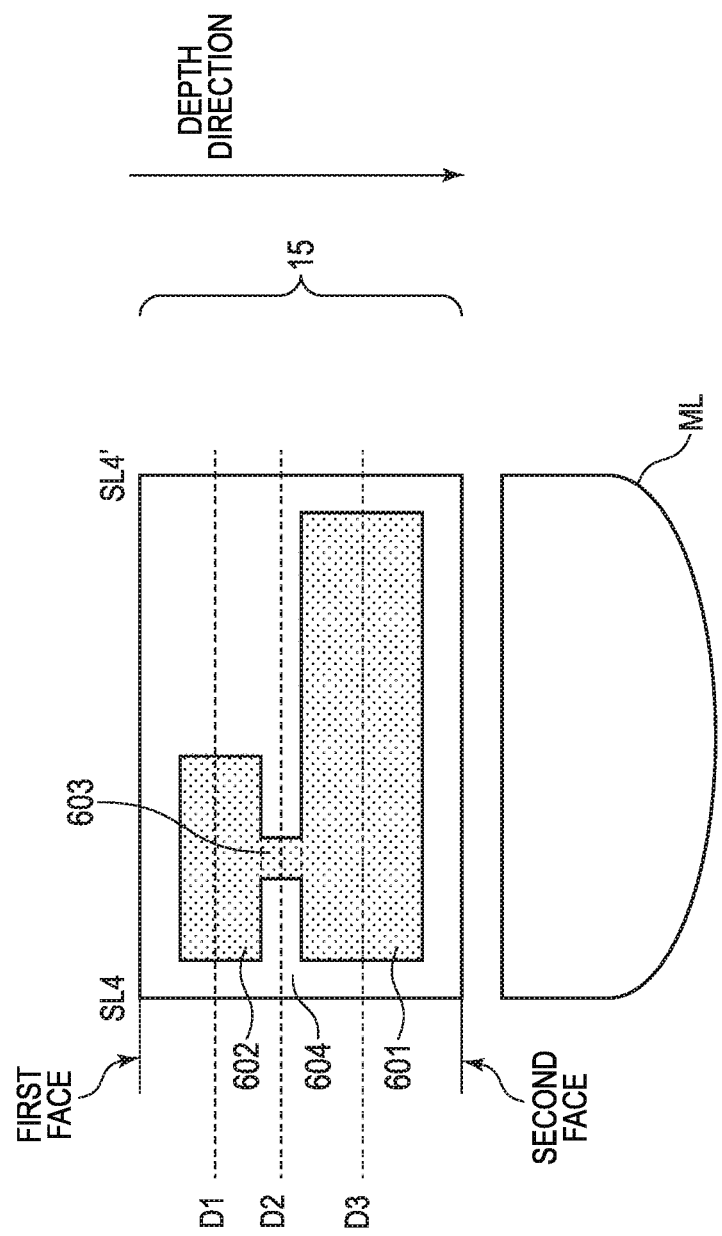
FIG. 32 is a schematic sectional view of the photodiode according to the tenth embodiment.
Figure 33:
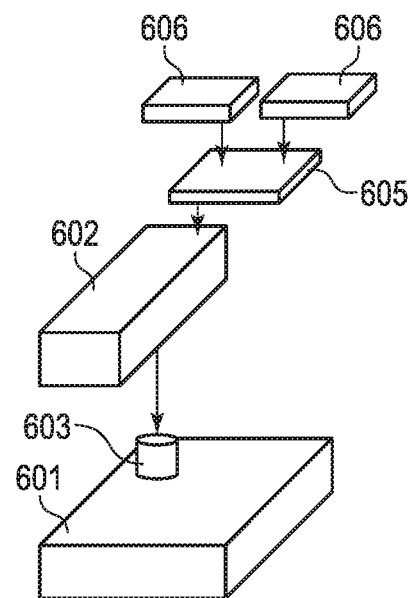
FIG. 33 is a schematic perspective view of the photodiode according to the tenth embodiment.
Figure 34:
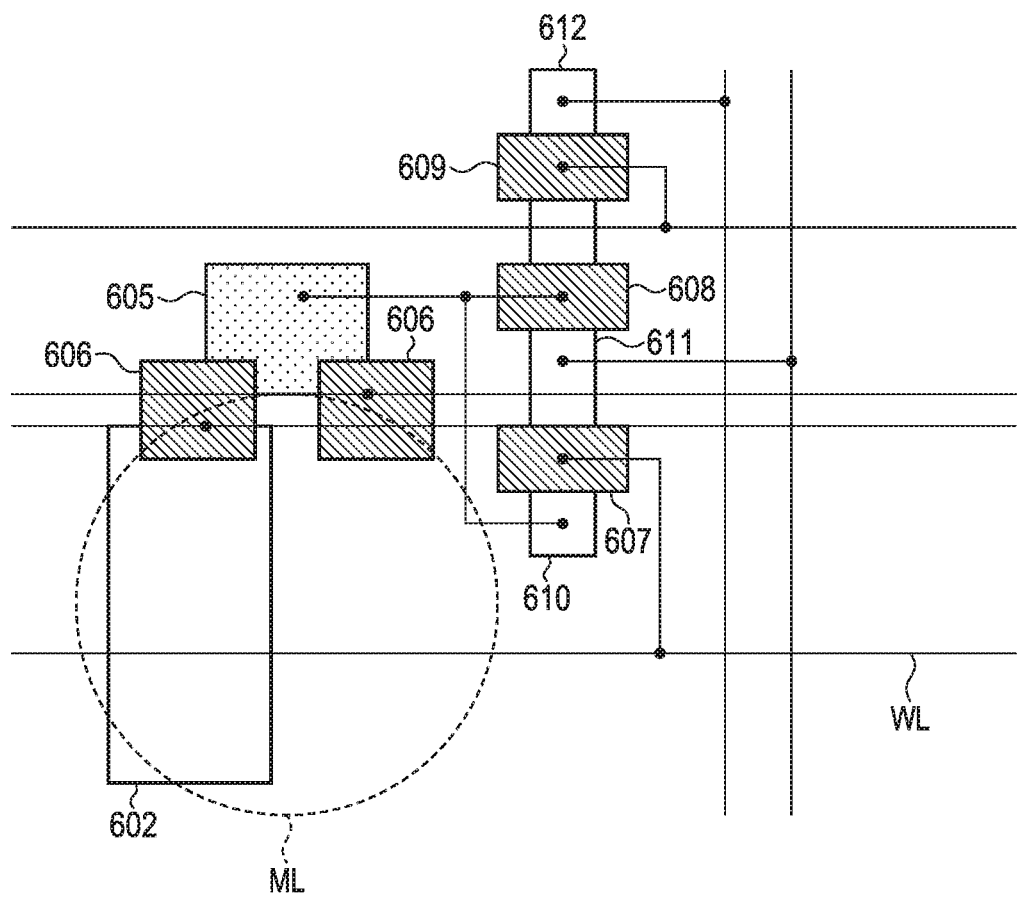
FIG. 34 is a schematic plan view of a pixel according to the tenth embodiment.

FIG. 31 is a schematic plan view of a photodiode according to the present embodiment. FIG. 32 is a schematic sectional view of the photodiode according to the present embodiment. FIG. 33 is a schematic perspective view of the photodiode according to the present embodiment. FIG. 34 is a schematic plan view of a pixel according to the present embodiment. Only one N-type semiconductor region 602 (a third photodiode group corresponding to a third micro-lens ML) is provided in the pixel 600 of FIG. 31 to FIG. 34. Further, the shape of the N-type semiconductor region 601 is deformed so as to cover substantially the whole micro-lens ML. In the present embodiment, the above features are different from those of FIG. 14, FIG. 15, or the like of the fifth embodiment.

As illustrated in FIG. 31 and FIG. 32, only one N-type semiconductor region 602 is arranged in the left side in the pixel 600. Further, as illustrated in FIG. 31 and FIG. 32, the N-type semiconductor region 601 is arranged so as to cover substantially the whole micro-lens ML. As illustrated in FIG. 33 and FIG. 34, since one N-type semiconductor regions 602 is arranged, only one N-type semiconductor region 603 is also arranged. Although the number of gate electrodes 606 may also be one, two gate electrodes 606 may be arranged in the same manner as in FIG. 18 in order to maintain symmetricity of arrangement, as illustrated in FIG. 33 and FIG. 34.

The pixel 600 of the present embodiment is used not for acquisition of signals used for image plane phase difference autofocusing but for acquisition of signals used for capturing. The single N-type semiconductor region 601 of the present embodiment has approximately twice the area and may generate twice the electrons of that of the fifth embodiment. Therefore, the sensitivity of a single output signal is approximately two times higher. Further, since the number of gate electrodes 606 required to be driven at the time of readout is one, faster readout is achieved.

As described above, according to the present embodiment, a photoelectric conversion device that can perform fast and high sensitive capturing is provided. The pixel 600 of the present embodiment is useful in a use of an electronic view finder or the like in which fast and high sensitive capturing is required. When some of the plurality of pixels 600 included in the pixel unit 61 of FIG. 12 are used as the pixels 600 of the present embodiment, a reduced image used for the electronic view finder can be acquired fast with high sensitivity.

Eleventh Embodiment

A photoelectric conversion device according to an eleventh embodiment will be described. In description of the present embodiment, features having the same function as those of the first embodiment to the tenth embodiment will be labeled with the same references, and detailed description thereof may be omitted or simplified. The photoelectric conversion device of the present embodiment is a photoelectric conversion device in which the shapes of the two N-type semiconductor regions 601 differ in the pixel 600 described in the fifth embodiment.

Figure 35:
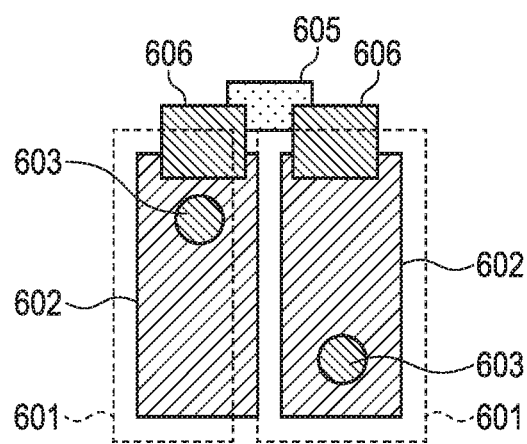
FIG. 35 is a schematic plan view illustrating the arrangement of semiconductor regions according to an eleventh embodiment.
Figure 36:
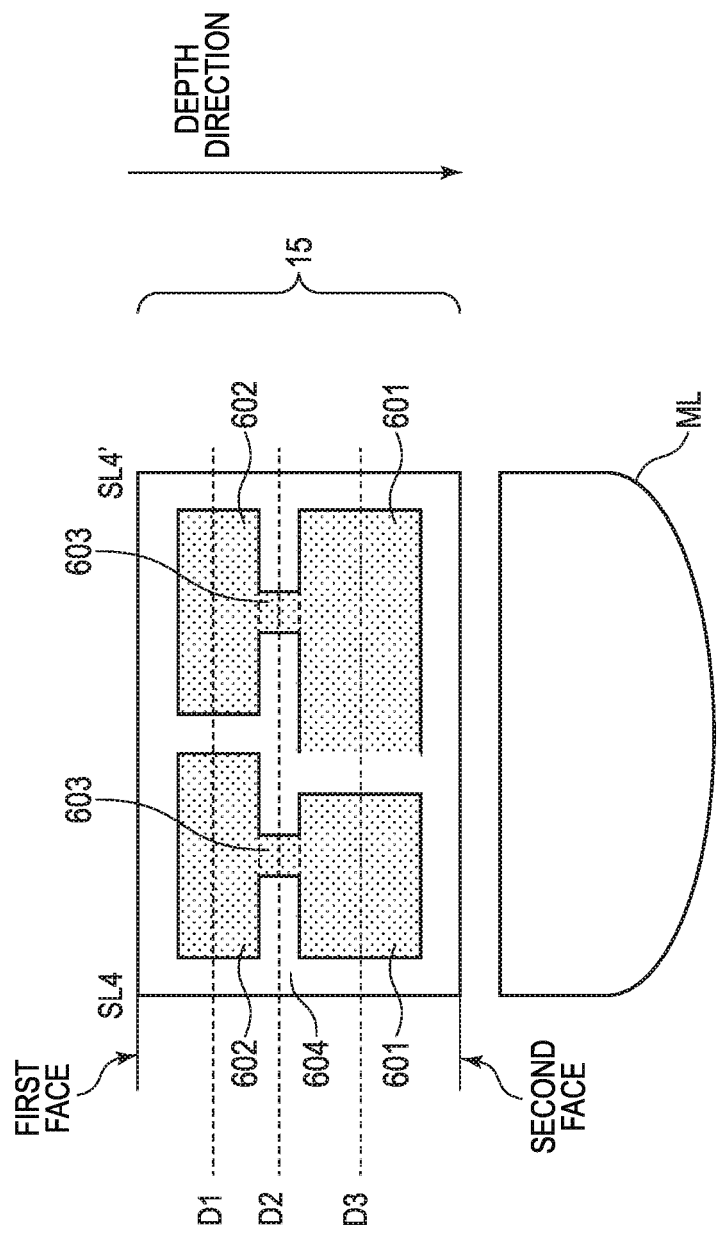
FIG. 36 is a schematic sectional view of photodiodes according to the eleventh embodiment.
Figure 37:
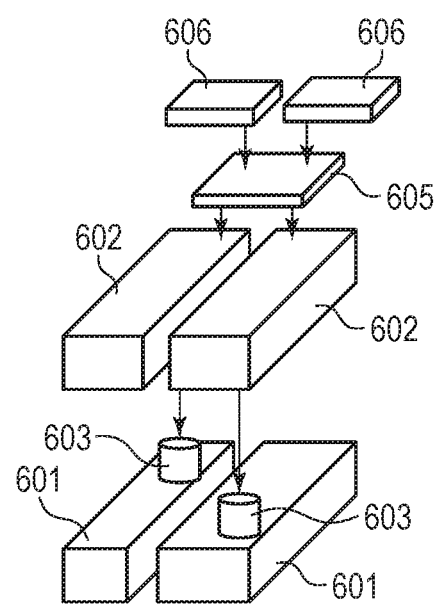
FIG. 37 is a schematic perspective view of the photodiodes according to the eleventh embodiment.

FIG. 35 is a schematic plan view illustrating the arrangement of semiconductor regions according to the present embodiment. FIG. 36 is a schematic sectional view of a photodiode according to the present embodiment. FIG. 37 is a schematic perspective view of the photodiode according to the present embodiment. The pixel 600 of FIG. 35 to FIG. 37 is different from that of FIG. 15, FIG. 19A, FIG. 19B, FIG. 19C, or the like of the fifth embodiment in that the two N-type semiconductor regions 601 have different shapes and areas from each other.

As illustrated in FIG. 35 and FIG. 36, the shape and the area in plan view and sectional view of the two N-type semiconductor regions 601 are different from each other. Further, as illustrated in FIG. 37, the two N-type semiconductor regions 601 have different shapes and volumes from each other.

On the pixel 600 located away from the center of the pixel unit 61, a light that has passed through the optical system of an imaging system such as a camera enters the imaging plane diagonally. Since the angle of this incident light affects the accuracy of image plane phase difference autofocusing, in order to reduce this, there is a scheme of shifting the optical axis of the micro-lens ML from the center of the pixel 600 for arrangement. In this case, it is desirable to shift the positions of the N-type semiconductor regions 601, which are sensitivity regions, from the center to have different shapes thereof taking the shift of the optical axis of the micro-lens ML into consideration. In such arrangement, the areas of the two N-type semiconductor regions 601 are different from each other in plan view.

In the present embodiment, since the shapes of the two N-type semiconductor regions 601 can differ from each other, it is possible to design the shape of the two N-type semiconductor regions 601 appropriately taking the position of the coordinates or the position of the micro-lens ML inside the pixel unit 61 into consideration. Accordingly, the accuracy of image plane phase difference autofocusing is improved over a wide range inside the pixel unit 61. Alternatively, a range inside the pixel unit 61 in which image plane phase difference autofocusing is possible is expanded. Note that, since the angle of an incident light to the pixel 600 changes gradually depending on the coordinates (image height) inside the pixel unit 61, given this change, it is desirable to change together the shapes of the N-type semiconductor regions 601 gradually in accordance with the coordinates (image height) inside the pixel unit 61.

As described above, according to the present embodiment, the shapes of two N-type semiconductor regions 601 are made different, and thereby a photoelectric conversion device having improved accuracy of image plane phase difference autofocusing is provided.

Twelfth Embodiment

A photoelectric conversion device according to a twelfth embodiment will be described. In description of the present embodiment, features having the same function as those of the first embodiment to the eleventh embodiment will be labeled with the same references, and detailed description thereof may be omitted or simplified. In the present embodiment, a modified example in which the arrangement scheme of the pixels 600 described in the fifth embodiment to the seventh embodiment is changed in various ways will be described.

Figure 38B:
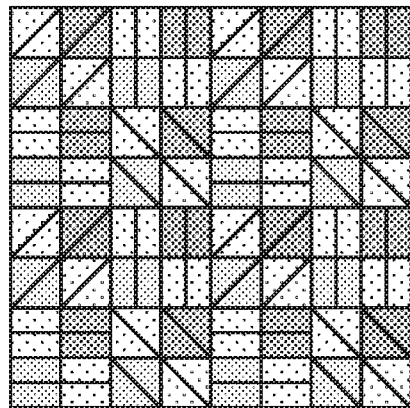
FIG. 38A, FIG. 38B, FIG. 38C, FIG. 38D, and FIG. 38E are schematic plan views illustrating an arrangement example of pixels according to a twelfth embodiment.
Figure 38A:
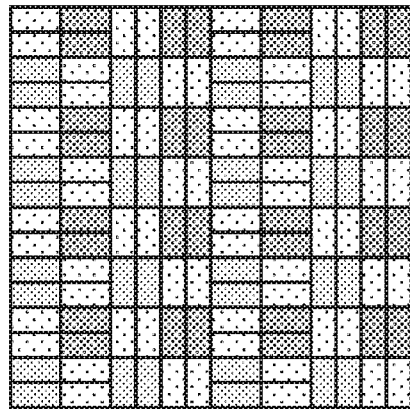
Figure 38D:
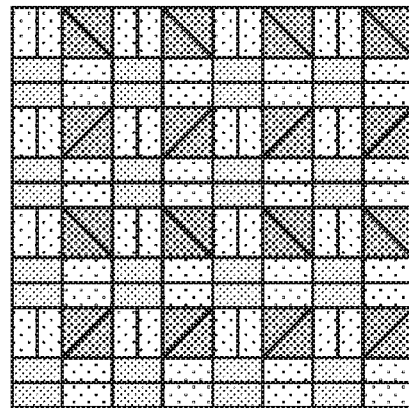
Figure 38C:
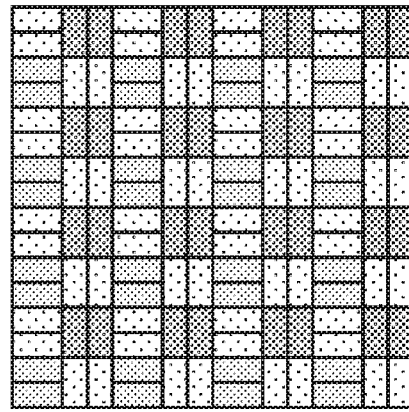
Figure 38E:
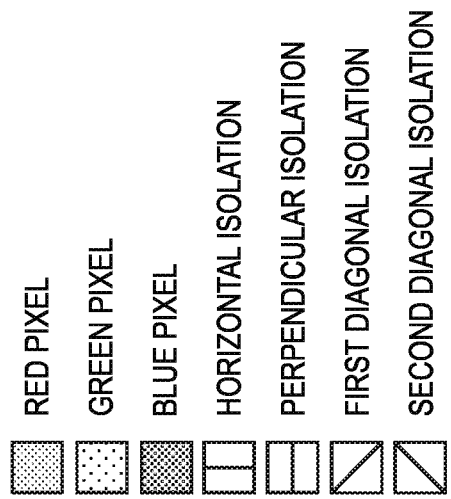

FIG. 38A, FIG. 38B, FIG. 38C, FIG. 38D, and FIG. 38E are schematic plan views illustrating arrangement examples of pixels according to the present embodiment. FIG. 38E illustrates legends used in FIG. 38A, FIG. 38B, FIG. 38C, and FIG. 38D.

Specifically, in FIG. 38A, FIG. 38B, FIG. 38C, and FIG. 38D, a pattern in a square frame representing the pixel 600 indicates which of a red pixel, a green pixel, or a blue pixel the pixel 600 is. In other words, such a pattern represents a color of the color filters CFR, CFG, and CFB provided on the pixels 600. As illustrated in FIG. 38A, FIG. 38B, FIG. 38C, and FIG. 38D, the color arrangement of the pixels 600 forms the Bayer arrangement in which the same arrangement is repeated, where four pixels of two rows by two columns are defined as one unit.

The orientation of a line added in a pattern inside a square frame representing the pixel 600 indicates the orientation of the region 604c, which isolates two N-type semiconductor regions 601 from each other, of the P-type semiconductor region 604. In other words, the shapes of two figures obtained by dividing a square by the line schematically represents the shape of two N-type semiconductor regions 601. As written in FIG. 38E, an isolation scheme in which two N-type semiconductor regions 601 are arranged next to each other in the horizontal direction is referred to as horizontal isolation. An isolation scheme in which two N-type semiconductor regions 601 are arranged next to each other in the vertical direction is referred to as perpendicular isolation. An isolation scheme in which two N-type semiconductor regions 601 are arranged next to each other in a direction between the left under and the right upper is referred to as first diagonal isolation. An isolation scheme in which two N-type semiconductor regions 601 are arranged next to each other in a direction between the left upper and the right under is referred to as second diagonal isolation. These isolation directions correspond to phase difference detection directions in image plane phase difference autofocusing.

In the example of FIG. 38A, the pixels 600 on the first row and the second row have the horizontal isolation, and the pixels 600 on the third row and the fourth row have the perpendicular isolation. The fifth row to the eighth row also have the same arrangement. In such a way, in the example of FIG. 38A, the same arrangement is repeated every four rows, where four rows including the two rows of the horizontal isolation and two rows of the perpendicular isolation are defined as one unit.

In the example of FIG. 38B, the pixels 600 on the first row and the second row have the arrangement in which the horizontal isolation and the first diagonal isolation are repeated, and the pixels 600 on the third row and the fourth row have the arrangement in which the second diagonal isolation and the perpendicular isolation are repeated. The fifth row to the eighth row also have the same arrangement. In such a way, in the example of FIG. 38B, the same arrangement is repeated, where four rows by four columns including the horizontal isolation, the perpendicular isolation, the first diagonal isolation, and the second diagonal isolation are defined as one unit.

In the example of FIG. 38C, the pixels 600 on the first row have the horizontal isolation, and the pixels 600 on the second row have the perpendicular isolation. The third and subsequent rows have the arrangement in which the above is repeated. In such a way, in the example of FIG. 38C, the same arrangement is repeated every two rows, where two rows including one row of the horizontal isolation and the one row of perpendicular isolation are defined as one unit. In this arrangement, a red pixel and a green pixel laterally next to the red pixel have the horizontal isolation, and a blue pixel and a green pixel laterally next to the blue pixel have the perpendicular isolation. In such a way, colors of pixels and isolation directions may be associated so that pixels of some of the colors have a regular isolation direction.

In the example of FIG. 38D, red pixels on the first row have the horizontal isolation, and green pixels on the first row have the perpendicular isolation. Further, green pixels on the second row have the perpendicular isolation, blue pixels on the second rows have repetition arrangement of the first diagonal isolation or the second diagonal isolation. The third and subsequent rows have the arrangement in which the above is repeated. In such a way, in the example of FIG. 38D, the same arrangement is repeated, where two rows by four columns including the horizontal isolation, the perpendicular isolation, the first diagonal isolation, and the second diagonal isolation are defined as one unit. In this arrangement, each red pixel and each green pixel laterally next to each blue pixel have the horizontal isolation, each green pixel laterally next to each red pixel has perpendicular isolation. Each blue pixel has the first diagonal isolation or the second diagonal isolation. In such a way, colors of pixels and isolation directions may be associated so that pixels of some of the colors have a regular isolation direction.

As described above, in the present embodiment, by including the pixels 600 of various isolation directions in the pixel unit 61, it is possible to obtain signals used for image plane phase difference autofocusing in various detection directions.

Note that the colors of the pixels 600 in the examples of FIG. 38A to FIG. 38E may be colors other than red, green, or blue. For example, the colors of pixels 600 may be cyan, magenta, and yellow that are complementary colors or may be white. Further, the pixel 600 may be an infrared pixel having an infrared filter that transmits infrared light and blocks visible light.

Further, the arrangement of the pixels 600 is not limited to the Bayer arrangement but may be another arrangement. For example, arrangement in which red pixels, green pixels, and blue pixels are arranged on the same row or the same column may be used, hexagonal arrangement in which hexagonal pixels are arranged may be used, or staggered arrangement in which pixel groups including a rectangle of the Bayer arrangement or the like defined as one unit are shifted each by a half pitch and arranged. Further, some of the pixels 600 may be replaced with pixels 600 in which the number of photodiodes of the eleventh embodiment is one.

Thirteenth Embodiment

An imaging system according to a thirteenth embodiment will be described. The imaging system of the present embodiment has the photoelectric conversion device of any of the first embodiment to the twelfth embodiment. An imaging system refers to a device used for capturing a static image or a moving image, such as a digital still camera, a digital video camera, a mobile phone digital camera, or the like.

Figure 39:
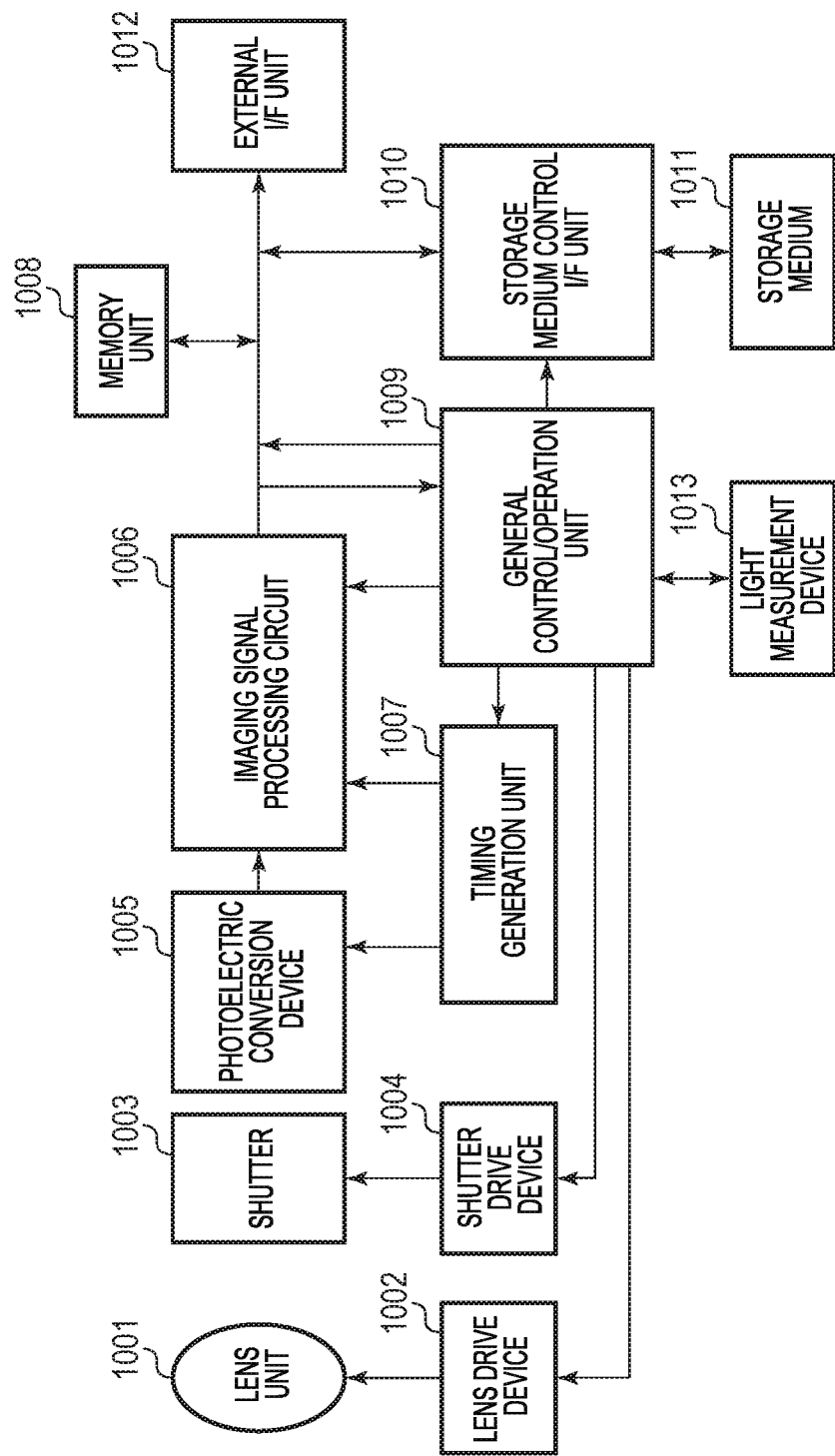
FIG. 39 is a block diagram of an imaging system according to a thirteenth embodiment.

FIG. 39 is a block diagram of the imaging system according to the thirteenth embodiment. The imaging system has a lens unit 1001, a lens drive device 1002, a shutter 1003, a shutter drive device 1004, a photoelectric conversion device 1005, an imaging signal processing circuit 1006, and a timing generation unit 1007. The imaging system further has a memory unit 1008, a general control/operation unit 1009, a storage medium control interface (I/F) unit 1010, a storage medium 1011, an external I/F unit 1012, and a light measurement device 1013.

The lens unit 1001 is a component that captures an optical image of a subject on the photoelectric conversion device 1005. The lens drive device 1002 is a device that drives the lens unit 1001. The lens drive device 1002 performs zoom control, focus control, aperture control, or the like by driving the lens unit 1001. The shutter 1003 is an optical member that blocks an incident light, and a mechanical shutter may be used, for example. Further, the shutter 1003 may also have an aperture function. The shutter drive device 1004 performs control of opening/closing or the like of the shutter 1003.

The photoelectric conversion device 1005 is the photoelectric conversion device of any of the first embodiment to the twelfth embodiment and converts an optical image of a subject captured by the lens unit 1001 into an image signal to acquire the image signal. The imaging signal processing circuit 1006 is a circuit that performs various correction, data compression, or the like on an image signal output from the photoelectric conversion device 1005. The timing generation unit 1007 is a circuit that outputs various timing signals to the photoelectric conversion device 1005 and the imaging signal processing circuit 1006.

The general control/operation unit 1009 is a control circuit that performs various operations and control of the overall imaging system. The memory unit 1008 is a storage device used for temporarily storing image data output from the imaging signal processing circuit 1006. The storage medium control I/F unit 1010 is an interface that performs storage or readout on the storage medium 1011. The storage medium 1011 is a removable storage medium such as a semiconductor memory and is used for storage or readout of image data. The external I/F unit 1012 is an interface used for externally providing various information, a captured image, or the like and may be a communication interface to communicate with another information processing device such as a computer, or may be a user interface such as a display device.

Next, the operation at capturing when the imaging system is a digital still camera having a ranging function will be described. In response to the main power supply of the imaging system being turned on, a power supply used for controlling the imaging system and a power supply used for capturing, which supplies power to the imaging signal processing circuit 1006 or the like, are sequentially turned on.

In response to a user pressing a release button (not illustrated), the photoelectric conversion device 1005 acquires an image signal, and the general control/operation unit 1009 performs a ranging operation based on data of an image signal and calculates a distance to a subject based on the result of the ranging operation. The lens drive device 1002 then drives the lens unit 1001 based on the calculated distance to determine whether or not focusing is successful and, if focusing is unsuccessful, performs focal adjustment by performing a process of driving the lens unit 1001 again. The ranging operation may be an operation performed by a dedicated ranging device (not illustrated) other than the operation using an image signal acquired by the photoelectric conversion device 1005.

Once focusing is confirmed, the imaging system starts a capturing operation. After the end of the capturing operation, an image signal output from the photoelectric conversion device 1005 is processed in the imaging signal processing circuit 1006 and written to the memory unit 1008 under the control of the general control/operation unit 1009. The imaging signal processing circuit 1006 performs rearrangement, addition, or the like of data. Data stored in the memory unit 1008 is stored in the storage medium 1011 via the storage medium control I/F unit 1010 under the control of the general control/operation unit 1009. Further, such data may be input to a computer or the like via the external I/F unit 1012. The computer can perform a process such as image edition on the data output from the imaging system.

The imaging system of the present embodiment has the photoelectric conversion device of any of the first to twelfth embodiments. Thus, according to the present embodiment, a higher quality imaging system is provided.

Fourteenth Embodiment

Figure 40A:
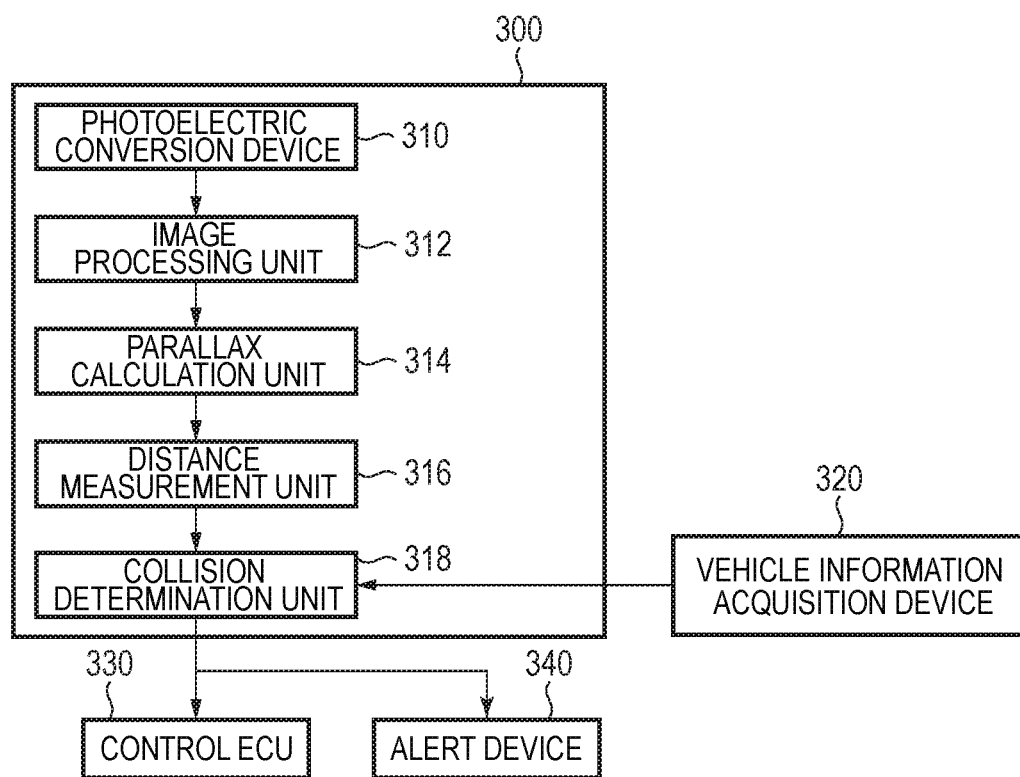
FIG. 40A and FIG. 40B are block diagrams of an imaging system and a mobile apparatus according to a fourteenth embodiment.
Figure 40B:
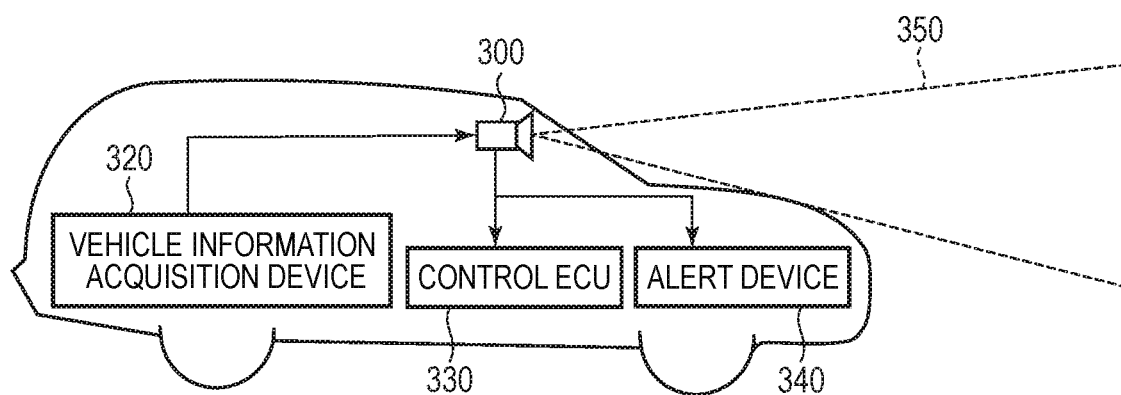

An imaging system and a mobile apparatus according to a fourteenth embodiment will be described. FIG. 40A and FIG. 40B are diagrams illustrating the configuration of an imaging system 300 and a mobile apparatus according to the present embodiment.

FIG. 40A illustrates one example of the imaging system 300 related to an on-vehicle camera. The imaging system 300 has a photoelectric conversion device 310. The photoelectric conversion device 310 of the present embodiment is the photoelectric conversion device described in any of the first to twelfth embodiments described above. The imaging system 300 has an image processing unit 312 that performs image processing on a plurality of image data acquired by the photoelectric conversion device 310 and a parallax calculation unit 314 that calculates a parallax (a phase difference of parallax images) from the plurality of image data acquired by the photoelectric conversion device 310. Further, the imaging system 300 has a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by combination thereof The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 40B illustrates an arrangement example of the imaging system 300 when a front area of a vehicle (a capturing area 350) is captured. The vehicle information acquisition device 320 transmits an instruction to the imaging system 300 or the photoelectric conversion device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system 300 is not limited to a vehicle such as the subject vehicle and can be applied to a mobile apparatus (moving apparatus) such as a ship, an airplane, or an industrial robot, for example. In addition, the imaging system 300 can be widely applied to a device which utilizes object recognition, such as an intelligent transportation system (ITS), without being limited to mobile apparatuses.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is one of the embodiments of the present invention.

Further, the device or the system illustrated in the thirteenth and fourteenth embodiments described above is configuration examples of a device or a system to which the photoelectric conversion device of the present invention may be applied. Thus, a device or a system to which the photoelectric conversion device of the present invention can be applied is not limited to the configuration illustrated in FIG. 39, FIG. 40A, or FIG. 40B.

Further, the conductivity type of a semiconductor region illustrated in the first to twelfth embodiments can be changed, and all the conductivity types may be opposite, for example. Further, the pixel arrangement illustrated in FIG. 4A, FIG. 4B, FIG. 4C, FIG. 6, FIG. 12, or FIG. 38A to FIG. 38E, the circuit configuration inside a pixel illustrated in FIG. 7 or FIG. 13, or the like are an example, and a different pixel arrangement or different circuit configuration may be employed.

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A photoelectric conversion device comprising:
   a first substrate having a first face;
   a second substrate provided on a side of a second face of the first substrate opposite to the first face; and
   a first photoelectric conversion unit and a second photoelectric conversion unit arranged in the first substrate and each including an avalanche photodiode,
   wherein the first photoelectric conversion unit and the second photoelectric conversion unit are configured to detect light incident from a side of the first face,
   wherein a difference between an area of the first photoelectric conversion unit and an area of the second photoelectric conversion unit in a cross section at a first depth from the first face is larger than a difference between an area of the first photoelectric conversion unit and an area of the second photoelectric conversion unit in a cross section at a second depth from the first face deeper than the first depth, and
   wherein the first substrate and the second substrate are jointed via a junction interface between insulating members and between metal members.

2. The photoelectric conversion device according to claim 1, wherein the area of the first photoelectric conversion unit in the cross section at the first depth is larger than the area of the second photoelectric conversion unit in the cross section at the first depth.

3. The photoelectric conversion device according to claim 2,
   wherein the first photoelectric conversion unit is configured such that light transmitted through a color filter that transmits green light is incident, and
   wherein the second photoelectric conversion unit is configured such that light transmitted through a color filter that transmits red light is incident.

4. The photoelectric conversion device according to claim 2,
   wherein the first photoelectric conversion unit is configured such that light transmitted through a color filter that transmits green light is incident, and
   wherein the second photoelectric conversion unit is configured such that light transmitted through a color filter that transmits blue light is incident.

5. The photoelectric conversion device according to claim 1, wherein the area of the first conversion unit in the cross section at the second depth is the same as the area of the second conversion unit in the cross section at the second depth.

6. The photoelectric conversion device according to claim 1 further comprising an isolation region provided between the first photoelectric conversion unit and the second photoelectric conversion element,
   wherein the isolation region extends in the cross section of the second depth along three directions.

7. The photoelectric conversion device according to claim 1 further comprising:
   a waveform shaping unit arranged in the second substrate and configured to shape a waveform of a signal output from the avalanche photodiode into a pulse signal.

8. The photoelectric conversion device according to claim 7 further comprising a counter circuit arranged in the second substrate and configured to count a pulse signal output from the waveform shaping unit.

9. The photoelectric conversion device according to claim 1, wherein the first photoelectric conversion unit and the second photoelectric conversion unit include a quench circuit connected to the avalanche photodiode.

10. The photoelectric conversion device according to claim 1 further comprising:
a first isolation region arranged at the first depth from the first face surrounding the first photoelectric conversion unit; and
a second isolation region arranged at the second depth from the first face surrounding the first photoelectric conversion unit,
wherein a shape of the first isolation region is different from a shape of the second isolation region.

11. The photoelectric conversion device according to claim 10, wherein the shape of the first isolation region is n-square, the shape of the second isolation region is m-square, the n and the m are natural numbers, the n is larger than the m, and the m is larger than 3.

12. The photoelectric conversion device according to claim 10 further comprising:
a third isolation region arranged at the first depth from the first face surrounding the second photoelectric conversion unit; and
a fourth isolation region arranged at the second depth from the first face surrounding the second photoelectric conversion unit,
wherein a shape of the third isolation region and a shape of the fourth isolation region are same.

13. The photoelectric conversion device according to claim 12, wherein an area of a region enclosed by the third isolation region is different from an area of a region enclosed by the fourth isolation region.

14. The photoelectric conversion device according to claim 12, wherein the shape of the third isolation region is k-square, the shape of the second isolation region is the k-square, the k is a natural number larger than 3.

15. The photoelectric conversion device according to claim 1 further comprising:
a third isolation region arranged at the first depth from the first face surrounding the second photoelectric conversion unit; and
a fourth isolation region arranged at the second depth from the first face surrounding the second photoelectric conversion unit,
wherein a shape of the third isolation region and a shape of the fourth isolation region are same.

16. The photoelectric conversion device according to claim 1, comprising a plurality of first photoelectric conversion units each being the first photoelectric conversion unit,
wherein the second photoelectric conversion unit is arranged between one of the plurality of first photoelectric conversion units and the other one of the plurality of first photoelectric conversion units, in a plan view.

17. An imaging system comprising:
the photoelectric conversion device according to claim 1; and
a signal processing unit configured to process signals output from the photoelectric conversion device.

18. A mobile apparatus comprising:
the photoelectric conversion device according to claim 1;
a distance information acquisition unit configured to acquire, from a parallax image based on signals from the photoelectric conversion device, distance information on a distance to an object; and
a control unit configured to control the mobile apparatus based on the distance information.

19. A photoelectric conversion device comprising:
a first substrate having a first face;
a second substrate provided on a side of a second face of the first substrate opposite to the first face; and
a photoelectric conversion unit arranged in the first substrate and including an avalanche photodiode,
wherein the photoelectric conversion unit is configured to detect light incident from a side of the first face,
wherein an area of the photoelectric conversion unit in a cross section at a first depth from the first face is smaller than an area of the photoelectric conversion unit in a cross section at a second depth from the first face deeper than the first depth, and
wherein the first substrate and the second substrate are jointed via a junction interface between insulating members and between metal members.

20. The photoelectric conversion device according to claim 19, wherein the photoelectric conversion unit is configured such that light transmitted through a color filter that transmits red light is incident.

21. The photoelectric conversion device according to claim 19, wherein the photoelectric conversion unit is configured such that light transmitted through a color filter that transmits blue light is incident.

22. The photoelectric conversion device according to claim 19 further comprising
a waveform shaping unit arranged in the second substrate and configured to shape a waveform of a signal output from the avalanche photodiode into a pulse signal.

23. The photoelectric conversion device according to claim 22 further comprising a counter circuit arranged in the second substrate and configured to count a pulse signal output from the waveform shaping unit.

24. The photoelectric conversion device according to claim 19, wherein the photoelectric conversion unit includes a quench circuit connected to the avalanche photodiode.

25. An imaging system comprising:
the photoelectric conversion device according to claim 19; and
a signal processing unit configured to process signals output from the photoelectric conversion device.

26. A mobile apparatus comprising:
the photoelectric conversion device according to claim 19;
a distance information acquisition unit configured to acquire, from a parallax image based on signals from the photoelectric conversion device, distance information on a distance to an object; and
a control unit configured to control the mobile apparatus based on the distance information.

* * * * *